(12) United States Patent  
Ellinghaus et al.

(10) Patent No.: US 12,520,540 B2
(45) Date of Patent: Jan. 6, 2026

(54) SEMICONDUCTOR DEVICE WITH GATE STRUCTURE AND CURRENT SPREAD REGION

(71) Applicant: Infineon Technologies AG, Neubiberg (DE)

(72) Inventors: Paul Ellinghaus, Unterhaching (DE); Sandeep Walia, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 596 days.

(21) Appl. No.: 17/945,467

(22) Filed: Sep. 15, 2022

(65) Prior Publication Data

US 2024/0096934 A1 Mar. 21, 2024

(51) Int. Cl.
| | |
|---|---|
| H10D 62/10 | (2025.01) |
| H01L 21/04 | (2006.01) |
| H10D 12/01 | (2025.01) |
| H10D 30/66 | (2025.01) |
| H10D 62/17 | (2025.01) |
| H10D 62/832 | (2025.01) |

(52) U.S. Cl.
CPC ....... *H10D 62/109* (2025.01); *H01L 21/0465* (2013.01); *H10D 12/031* (2025.01); *H10D 30/668* (2025.01); *H10D 62/393* (2025.01); *H10D 62/8325* (2025.01)

(58) Field of Classification Search
None
See application file for complete search history.

(56) References Cited

U.S. PATENT DOCUMENTS

| | | | |
|---|---|---|---|
| 9,478,655 B2 | 10/2016 | Siemieniec et al. | |
| 2015/0340487 A1 | 11/2015 | Siemieniec et al. | |
| 2020/0111874 A1 | 4/2020 | Meiser et al. | |
| 2020/0381253 A1 | 12/2020 | Schulze et al. | |
| 2021/0167203 A1 | 6/2021 | Meiser et al. | |
| 2021/0343834 A1 | 11/2021 | Lichtenwalner | |
| 2024/0096934 A1* | 3/2024 | Ellinghaus | H10D 12/031 |

FOREIGN PATENT DOCUMENTS

| | | |
|---|---|---|
| CN | 107039243 A | 8/2017 |
| CN | 109920854 A | 6/2019 |
| CN | 114038908 A | 2/2022 |
| WO | 2018225600 A1 | 12/2018 |

* cited by examiner

*Primary Examiner* — Jack S Chen
(74) *Attorney, Agent, or Firm* — Cooper Legal Group LLC

(57) ABSTRACT

According to some embodiments, a method for manufacturing a semiconductor device is provided. One or more first implantation processes are performed to form an implanted region, of a first conductivity type, in a semiconductor body. A trench is formed in the semiconductor body. After forming the trench, a second implantation process is performed to form a current spread region, of a second conductivity type, in the semiconductor body. The second implantation process includes implanting first dopants, through a top surface of the semiconductor body, to form a first portion of the current spread region, and implanting second dopants, through a bottom of the trench, to form a second portion of the current spread region. A gate structure is formed in the trench. A vertical position of the first portion of the current spread region matches a vertical position of the gate structure. The second portion of the current spread region underlies the gate structure.

16 Claims, 12 Drawing Sheets

SEMICONDUCTOR DEVICE WITH GATE STRUCTURE AND CURRENT SPREAD REGION

TECHNICAL FIELD

The present disclosure relates to semiconductor devices.

BACKGROUND

A semiconductor device may be used in mobile phones, laptops, desktops, tablets, watches, gaming systems, industrial electronics, commercial electronics, and/or consumer electronics. A semiconductor device may comprise an electrical contact between a semiconductor and a metal that may be used to connect a component within the semiconductor device to external circuitry.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method for manufacturing a semiconductor device is provided. One or more first implantation processes may be performed to form an implanted region, of a first conductivity type, in a semiconductor body. A trench may be formed in the semiconductor body. After forming the trench, a second implantation process may be performed to form a current spread region, of a second conductivity type, in the semiconductor body. The second implantation process may comprise implanting first dopants, through a top surface of the semiconductor body, to form a first portion of the current spread region, and implanting second dopants, through a bottom of the trench, to form a second portion of the current spread region. A gate structure may be formed in the trench. A vertical position of the first portion of the current spread region matches a vertical position of the gate structure. The second portion of the current spread region underlies the gate structure.

In an embodiment, a method for manufacturing a semiconductor device is provided. One or more first implantation processes are performed to form an implanted region, of a first conductivity type, in a semiconductor body. A second implantation process is performed. The second implantation process comprises implanting first dopants of a second conductivity type, through a top surface of the semiconductor body, to form a first portion of a current spread region. After performing the second implantation process, a trench may be formed in the semiconductor body. After forming the trench, a third implantation process may be performed. The third implantation comprises implanting second dopants of the second conductivity type, through a bottom of the trench, to form a second portion of the current spread region. A gate structure is formed in the trench. A vertical position of the first portion of the current spread region matches a vertical position of the gate structure. The second portion of the current spread region underlies the gate structure.

In an embodiment, a semiconductor device is provided. The semiconductor device may comprise a semiconductor body comprising a body region of a first conductivity type, a current spread region of a second conductivity type, and an implanted region of the first conductivity type. The semiconductor device may comprise a trench gate structure, in the semiconductor body, comprising a gate electrode and a gate dielectric layer separating the gate electrode from the semiconductor body. The implanted region and the current spread region form a pn-junction. A vertical position of a first portion of the current spread region matches a vertical position of the trench gate structure and the first portion of the current spread region adjoins a first sidewall of the trench gate structure. A second portion of the current spread region underlies the trench gate structure. A difference between a first vertical distance and a second vertical distance is at most 200 nanometers. The first vertical distance corresponds to a distance between a vertical position of a top side of the first portion of the current spread region and a vertical position of a top surface of the semiconductor body. The second vertical distance corresponds to a distance between a vertical position of a top side of the second portion of the current spread region and a vertical position of a bottom side of the trench gate structure.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1A:
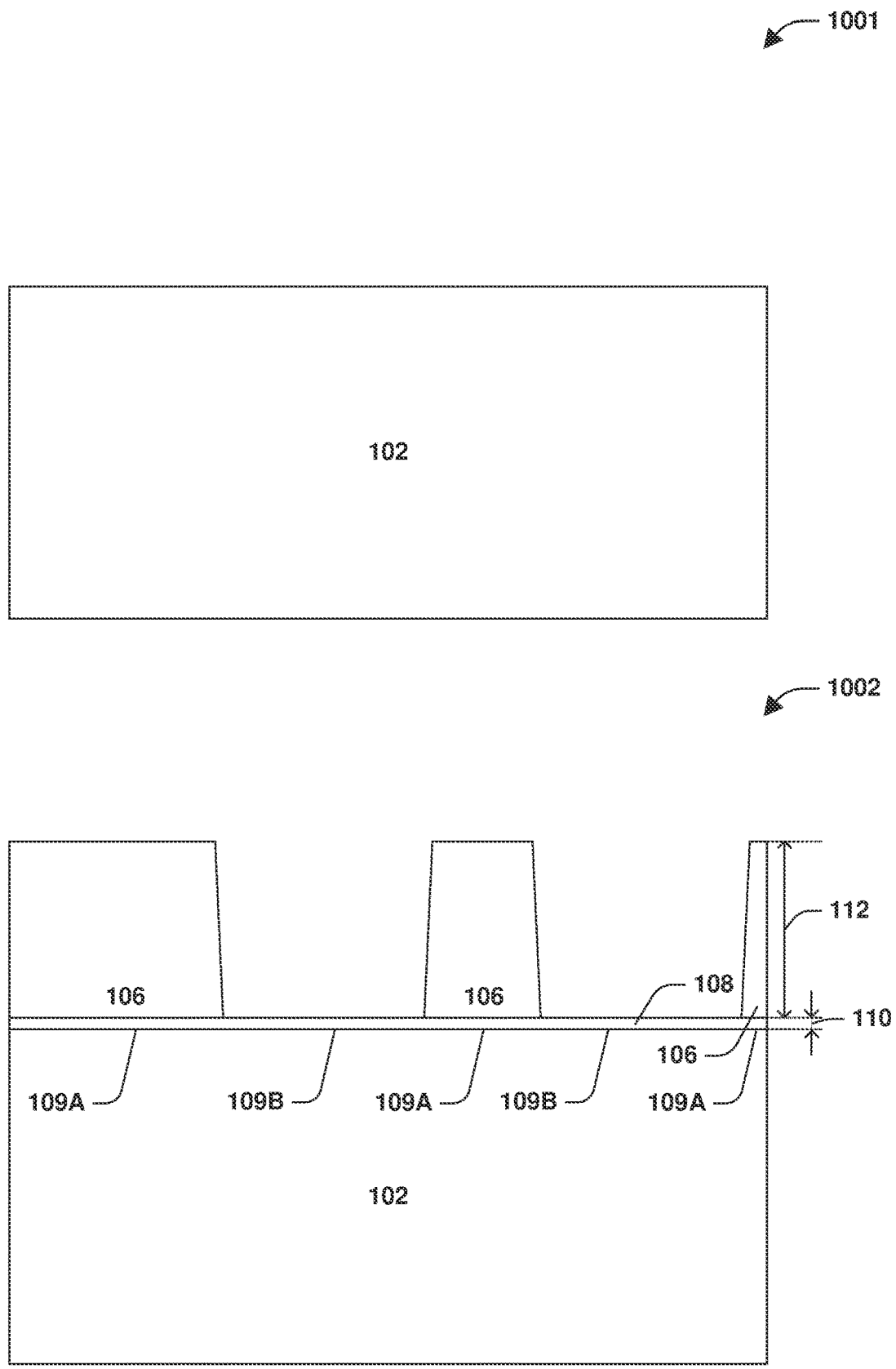
FIG. 1A schematically illustrates acts of manufacturing a semiconductor device according to various examples.
Figure 1B:
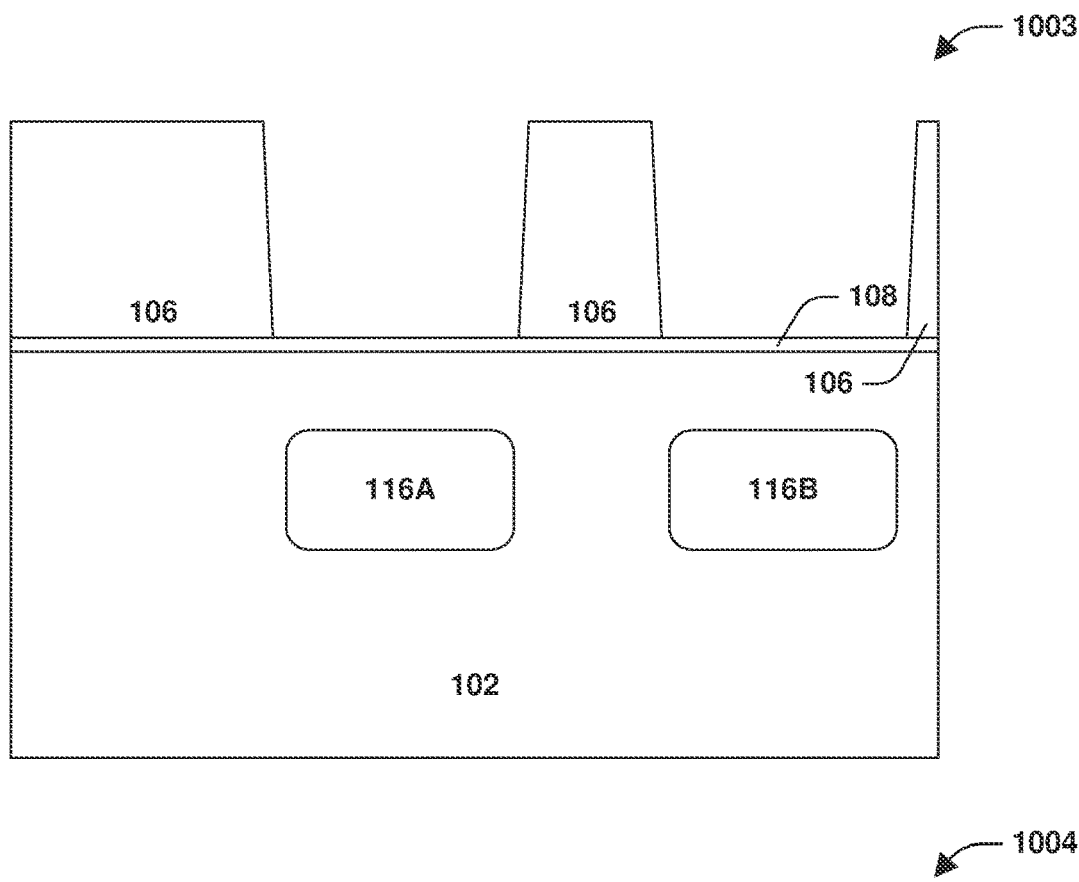
FIG. 1B schematically illustrates an act of manufacturing a semiconductor device according to various examples.
Figure 1B:
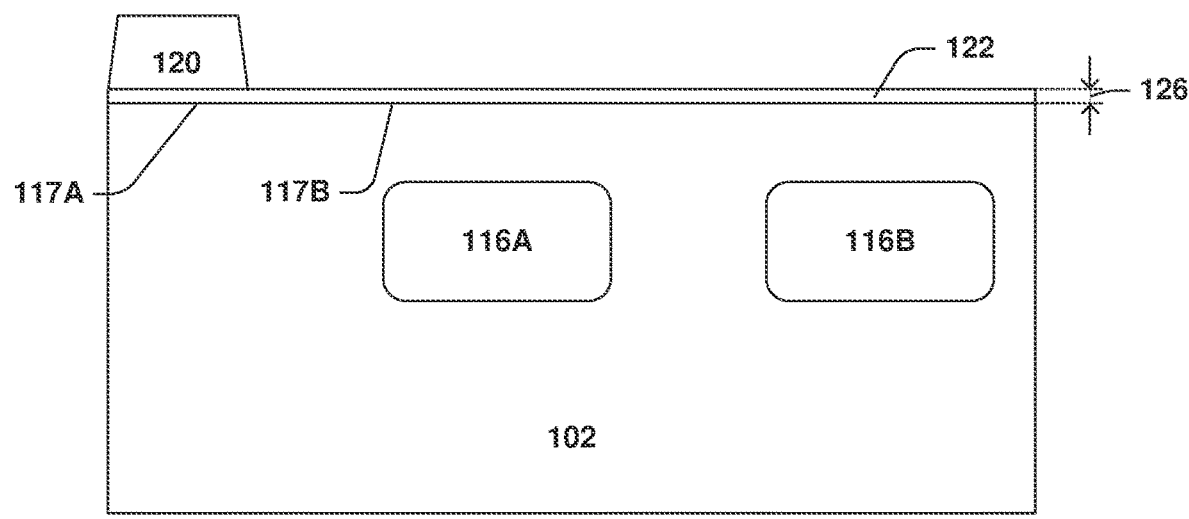
Figure 1C:
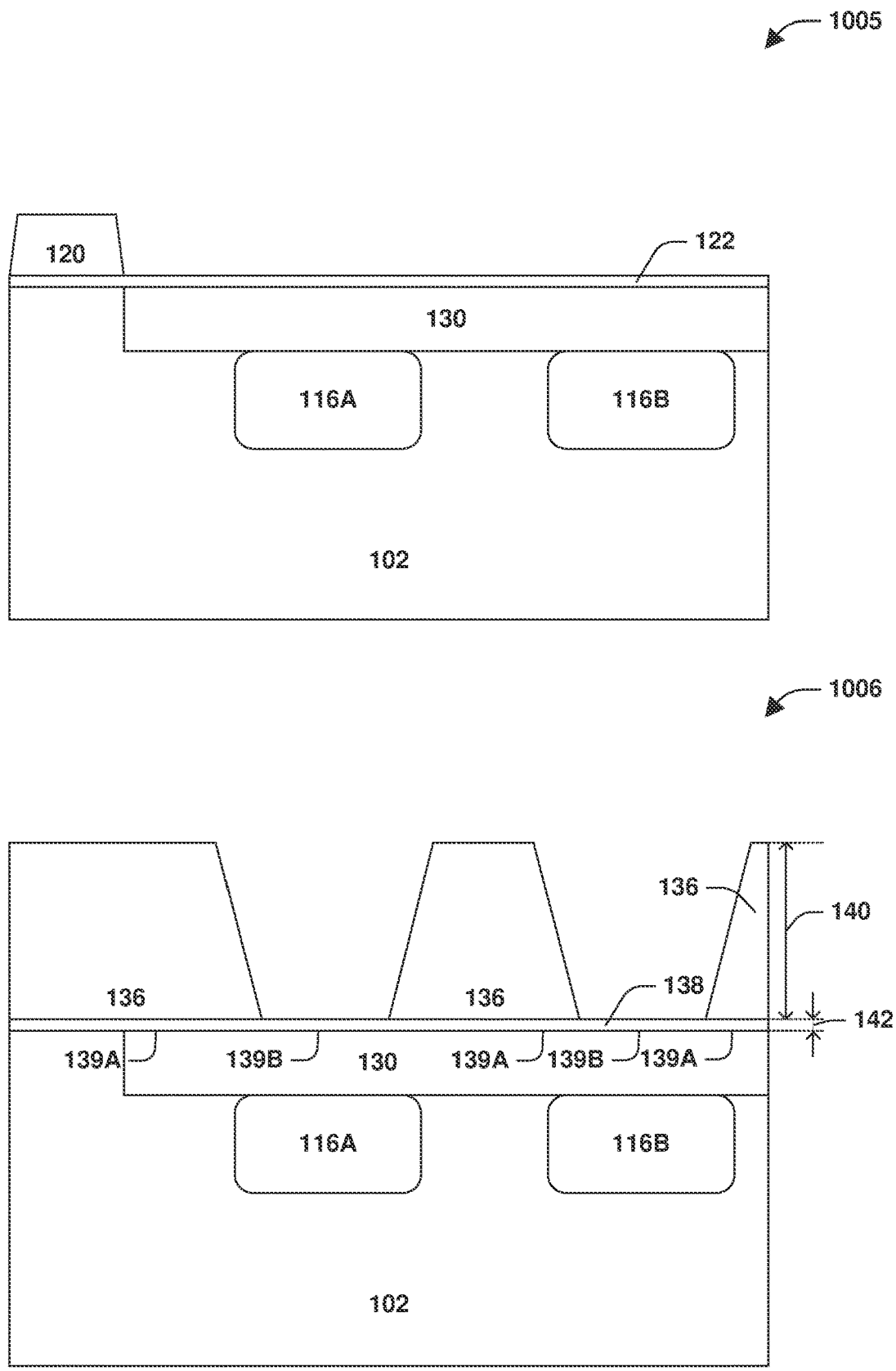
FIG. 1C schematically illustrates a semiconductor device according to various examples.
Figure 1D:
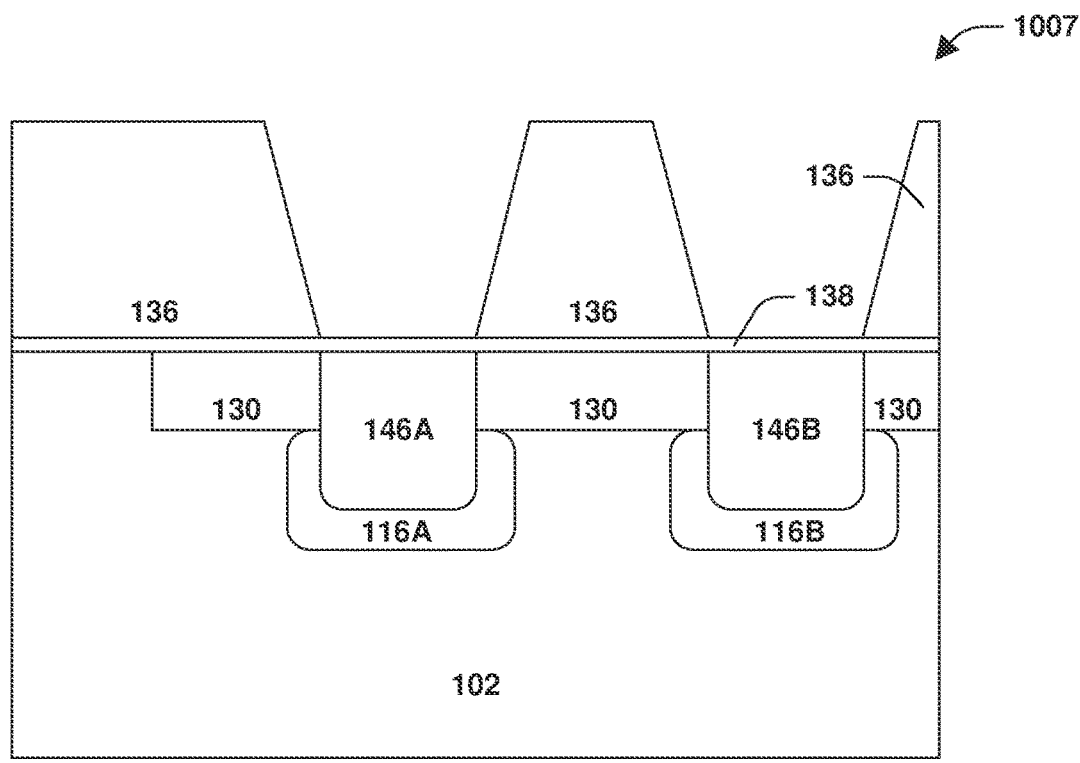
FIG. 1D schematically illustrates an act of manufacturing a semiconductor device according to various examples.
Figure 1D:
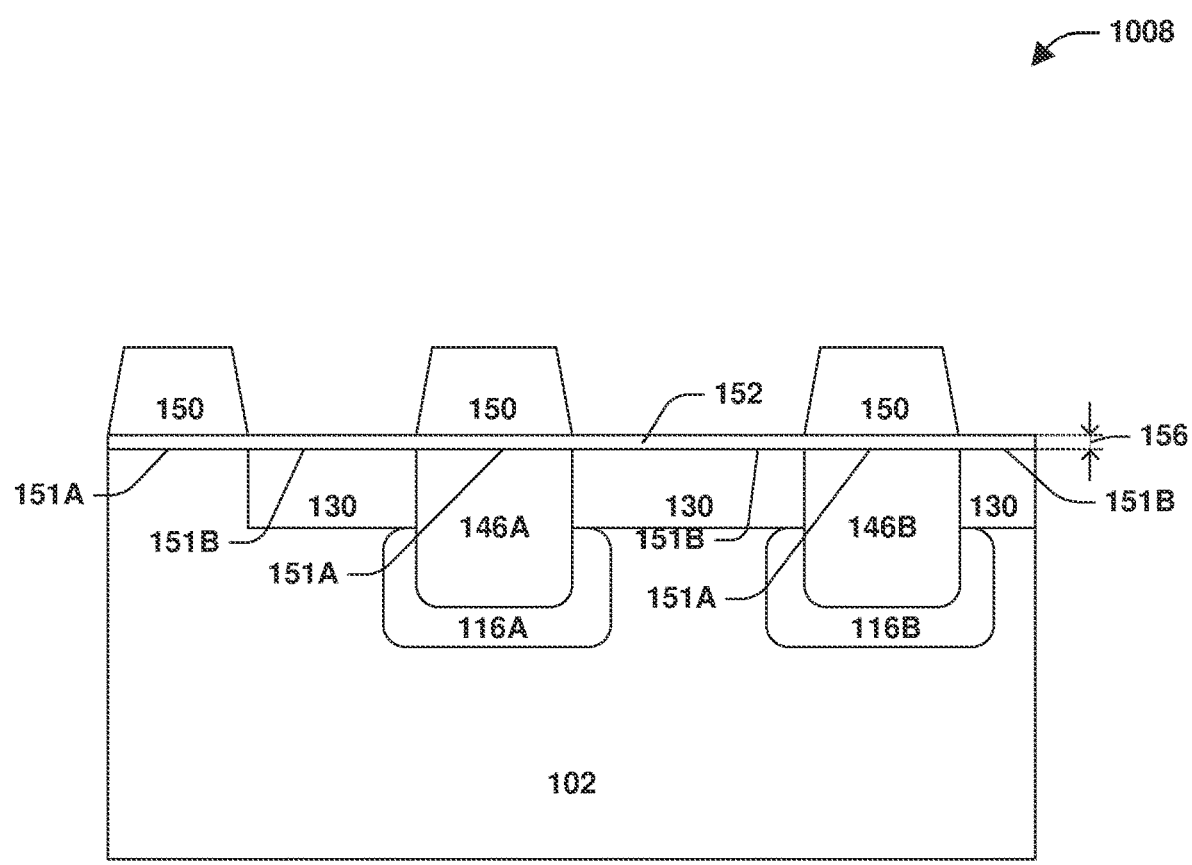
Figure 1E:
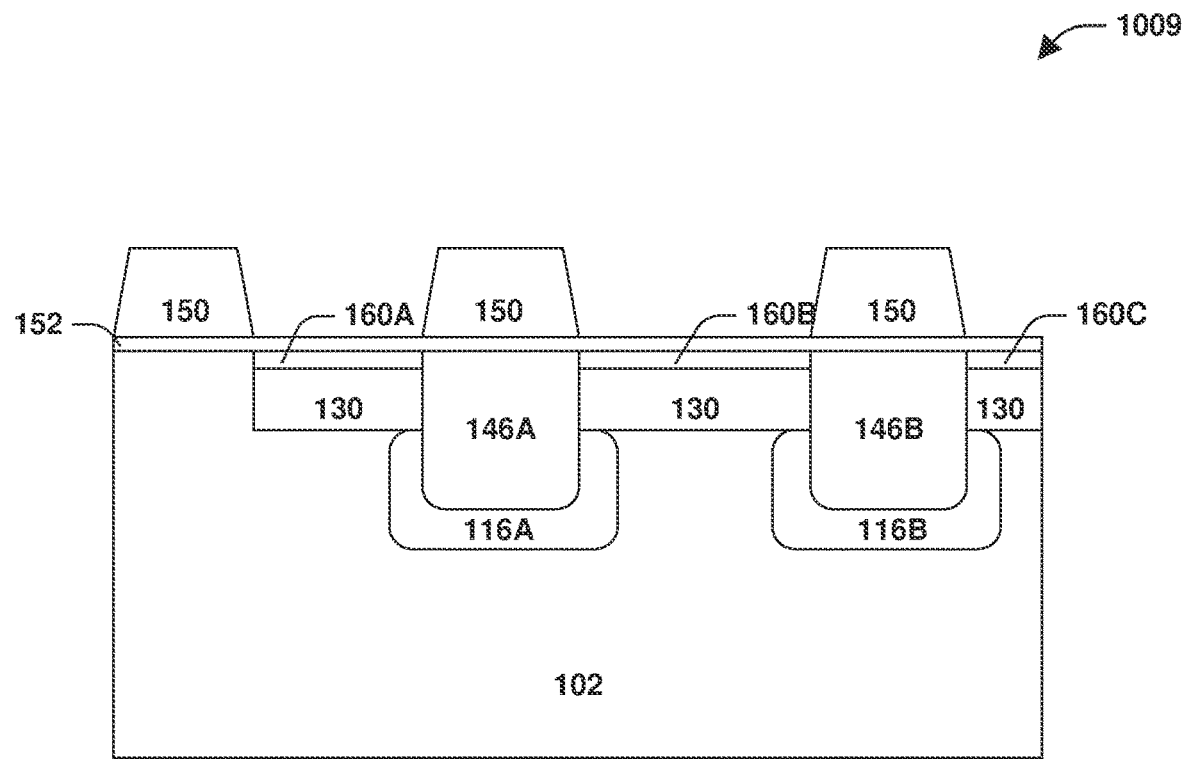
FIG. 1E schematically illustrates acts of manufacturing a semiconductor device according to various examples.
Figure 1E:
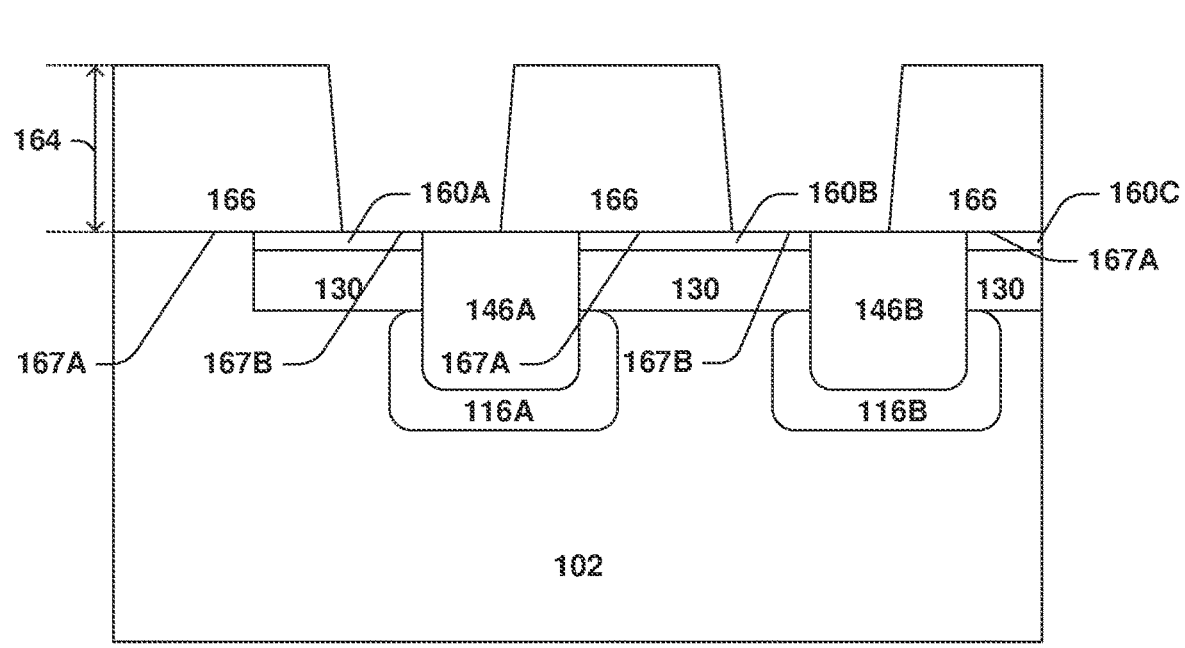
Figure 1F:
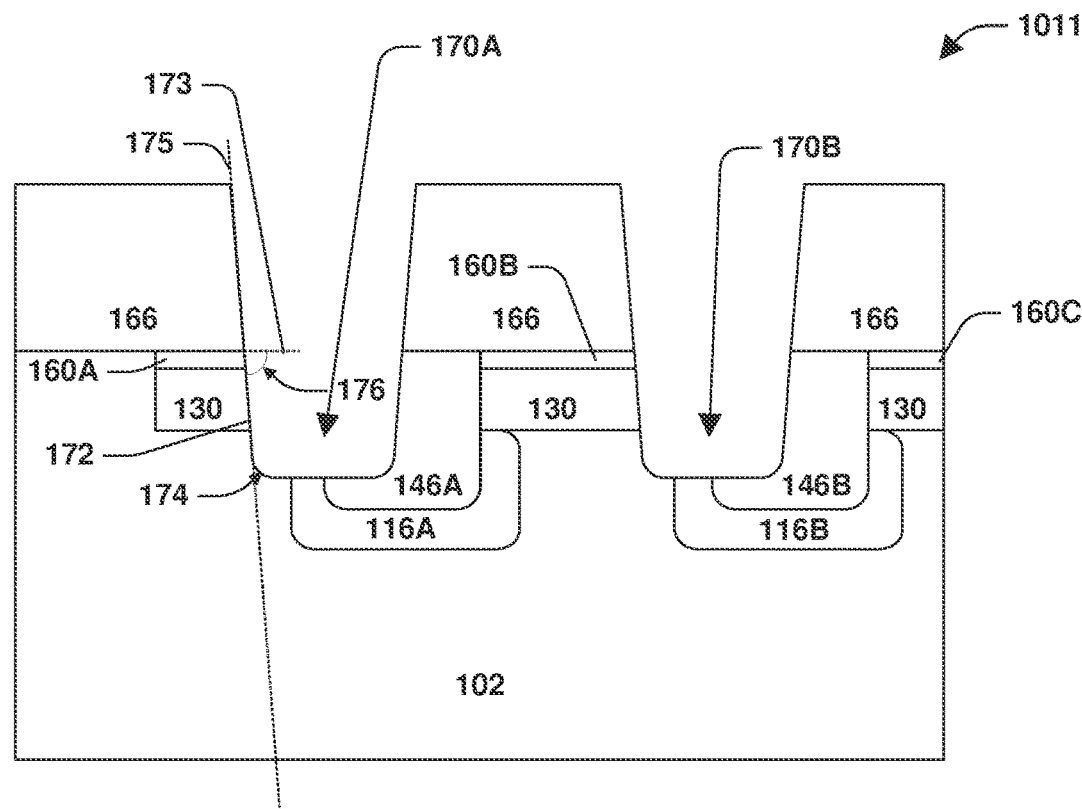
FIG. 1F schematically illustrates acts of manufacturing a semiconductor device according to various examples.
Figure 1F:
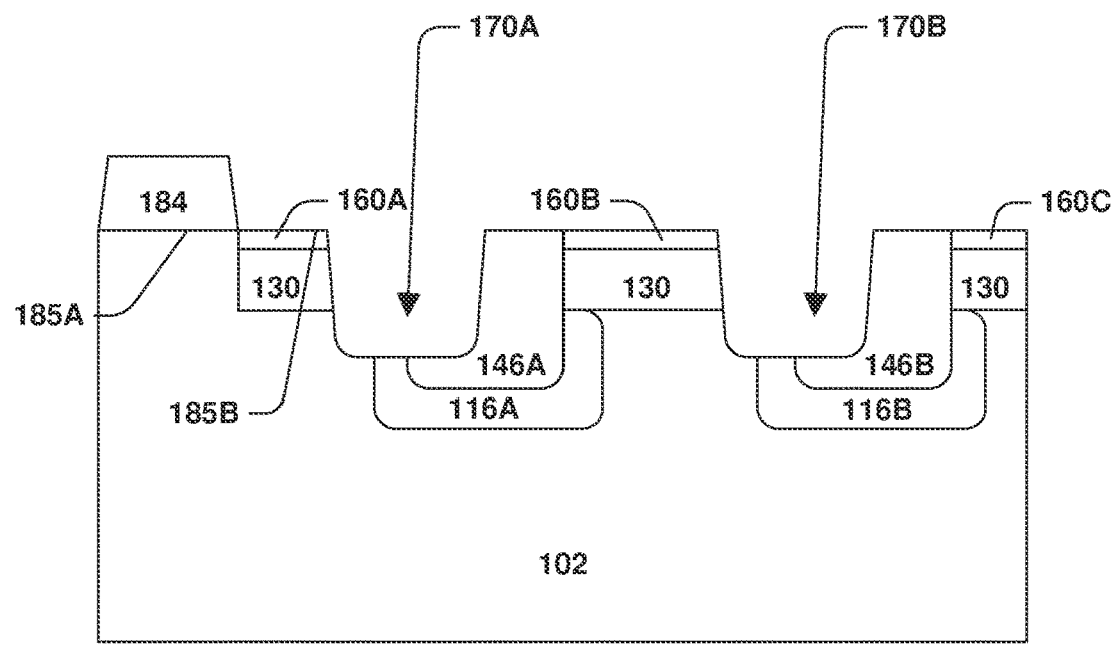

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

A semiconductor device, such as a transistor, may comprise one or more doped regions and a gate structure, such as a trench gate structure. In some embodiments, the gate structure is formed by forming a trench in a semiconductor body, and forming the gate structure in the trench. The one or more doped regions may comprise one or more first regions of a first conductivity type (e.g., p-type) and/or a current spread region of a second conductivity type (e.g., n-type). In some embodiments, a vertical position of a first portion of the current spread region matches a vertical position of the gate structure (e.g., a vertical position of at least some of the first portion of the current spread region matches a vertical position of at least some of the gate structure). A second portion of the current spread region underlies the gate structure. The positions of the first portion and/or the second portion of the current spread region relative to the gate structure may provide for an improvement to electrical performance of the semiconductor device, such as on-state resistance (Ron.A). In some systems, an implantation process, performed to form the current spread region in the semiconductor body, is performed prior to forming the trench. Thus, a high implantation energy level of the implantation process may be required in order to implant dopants (of the second conductivity type) to a desired depth (e.g., under the subsequently formed gate structure) in the semiconductor body.

In accordance with the present disclosure, a semiconductor device and a method of manufacturing the semiconductor device are provided. In some embodiments, the semiconductor device may comprise a transistor, such as a field-effect transistor (FET), a metal-oxide-semiconductor FET (MOSFET), an insulated-gate bipolar transistor (IGBT) and/or other type of transistor. In an example, the transistor is a MOSFET (e.g., a vertical MOSFET). The semiconductor device may comprise a current spread region and/or a gate structure, such as a trench gate structure. In some examples, a trench may be formed in a semiconductor body, and the gate structure may be formed in the gate structure. In some examples, an implantation process may be performed, after formation of the trench and prior to formation of the gate structure, to form at least some of the current spread region, such as at least a portion of the current spread region that underlies the subsequently formed gate structure (e.g., dopants, of the second conductivity type, may be implanted through a bottom of the trench). In an example, the implantation process may comprise a blanket implantation (extending horizontally across at least a portion of the semiconductor body, for example) in which first dopants of the second conductivity type are implanted through the top surface of the semiconductor body to form a first portion of the current spread region that has a vertical position matching a vertical position of the subsequently formed gate structure and second dopants of the second conductivity type are implanted through the bottom of the trench to form a second portion of the current spread region underlying the subsequently formed gate structure. Accordingly, by performing the implantation process after formation of the trench and prior to formation of the gate structure, the current spread region may be automatically aligned with the subsequently formed gate structure such that a vertical position of the first portion matches a vertical position of the gate structure and such that the second portion underlies the gate structure. Alternatively and/or additionally, since the second portion is formed via implanting dopants through the bottom of the trench, an implantation energy level required to implant dopants to a desired depth under the subsequently formed gate structure is reduced. The reduced implantation energy level of the implantation process may provide for: (i) reduced power consumption for forming the current spread region; (ii) increased ion flux and/or reduced implantation time; and/or (iii) enabling a larger variety of dopant implanting tools to be used to perform the implantation process to form the current spread region (e.g., since the implantation energy level is lower, there are more dopant implanting tools available that are capable of performing a implantation shot with the implantation energy level), thereby improving tool redundancy.

In an embodiment of the presently disclosed embodiments, a method of manufacturing a semiconductor device is provided. The method may comprise performing one or more first implantation processes to form an implanted region, of a first conductivity type, in a semiconductor body. In some examples, the first conductivity type is p-type. The implanted region may correspond to a shielding region, such as a region configured to provide shielding to a gate structure of the semiconductor device. In some examples, the implanted region (e.g., the shielding region) may comprise a bury region (e.g., p-bury region) and/or a p-top region. In some examples, the semiconductor body comprises a semiconductor substrate, such as a silicon carbide (SiC) substrate. The semiconductor body may comprise one or more epitaxial layers overlying the semiconductor substrate. The one or more epitaxial layers may comprise a SiC epitaxial layer. The one or more epitaxial layers may be grown on the semiconductor substrate.

The method may comprise forming a trench in the semiconductor body. An etching process may be performed to form the trench. In some examples, a patterned mask is formed over the top surface of the semiconductor body. The trench may be formed using the patterned mask.

The method may comprise performing a second implantation process to form a current spread region, of a second conductivity type, in the semiconductor body. In some examples, the second conductivity type is n-type. Although examples are provided herein in which the first conductivity type is p-type and the second conductivity type is n-type, embodiments are contemplated in which the first conductivity type is n-type and the second conductivity type is p-type.

The second implantation process may be performed after the trench is formed. The second implantation process may comprise implanting first dopants, through a top surface of the semiconductor body, to form a first portion of the current spread region, and implanting second dopants, through a bottom of the trench, to form a second portion of the current spread region. In some examples, the first dopants and the second dopants are implanted concurrently, such as via a blanket implantation of the second implantation process.

In some examples, the patterned mask (used to form the trench) is removed prior to the second implantation process.

The method may comprise forming a gate structure in the trench. A vertical position of the first portion of the current spread region matches a vertical position of the gate structure (e.g., a vertical position of at least some of the first portion of the current spread region matches a vertical position of at least some of the gate structure). The second portion of the current spread region underlies the gate structure.

In some examples, formation of the gate structure comprises forming a gate dielectric layer in the trench, and/or forming a gate electrode in the trench. The gate dielectric layer may separate the gate electrode from the semiconductor body.

In some examples, the first portion of the current spread region adjoins a first sidewall of the gate structure. The implanted region, of the first conductivity type, may adjoin a second sidewall, of the gate structure, opposite the first sidewall of the gate structure.

In some examples, a maximum implantation energy level of the second implantation process may be at most 2,000 kiloelectron volts (keV). In some implementations in which the current spread region is formed via an implantation process performed before the trench is formed, a required maximum implantation energy level of the implantation process may exceed the maximum implantation energy level of the second implantation process (e.g., the required maximum implantation energy level of the implantation process may be more than 2,000 keV, such as up to 4,000 keV) in order to implant dopants deep enough to reach a desired depth under the subsequently formed gate structure.

In some examples, a difference between a first vertical distance and a second vertical distance is at most 200 nanometers, such as at most 100 nanometers, at most 50 nanometers, and/or at most 10 nanometers (and/or the first vertical distance may be about equal to the second vertical distance). The first vertical distance corresponds to a distance between a vertical position of the top surface of the semiconductor body (through which dopants are implanted in the second implantation process to form the first portion of the current spread region) and a vertical position of a top side of the first portion of the current spread region. The second vertical distance corresponds to a distance between a vertical position of a bottom side of the gate structure and a vertical position of a top side of the second portion of the current spread region.

The method may comprise performing a third implantation process to form a body region, of the first conductivity type, in the semiconductor body. At least a portion of the body region overlies the first portion of the current spread region and/or adjoins the first sidewall of the gate structure. In some examples, the body region defines a channel of the semiconductor device, such as a channel between a source region (overlying the body region, for example) and the current spread region.

In some examples, the implanted region of the first conductivity type (e.g., the shielding region) and the current spread region form a pn-junction.

In some examples, one or more parameters (e.g., a quantity of implantation shots, an implantation energy level and/or an ion implantation dose) associated with the top side of the first portion of the current spread region adjoining the body region are selected, wherein the second implantation process is performed using the one or more parameters. For example, the one or more parameters (of the second implantation process) may be selected such that the top side of the first portion of the current spread region adjoins the body region.

In some examples, one or more parameters (e.g., a quantity of implantation shots, an implantation energy level and/or an ion implantation dose) associated with a vertical position of a bottom side of the first portion of the current spread region being lower than or equal to a vertical position of a top side of the second portion of the current spread region are selected, wherein the second implantation process is performed using the one or more parameters. For example, the one or more parameters (of the second implantation process) may be selected such that the vertical position of the bottom side of the first portion of the current spread region is lower than or equal to the vertical position of the top side of the second portion of the current spread region.

In some examples, one or more parameters (e.g., a quantity of implantation shots, an implantation energy level and/or an ion implantation dose) associated with forming the first portion of the current spread region to extend from a first vertical position, that is higher than a vertical position of the bottom of the trench, to a second vertical position that is the same as or lower than the vertical position of the bottom of the trench are selected, wherein the second implantation process is performed using the one or more parameters. For example, the one or more parameters (of the second implantation process) may be selected such that the first portion of the current spread region extends from the first vertical position, that is higher than the vertical position of the bottom of the trench, to the second vertical position that is the same as or lower than the vertical position of the bottom of the trench.

In some examples, the third implantation process is performed after the trench is formed. In an example, the third implantation process may comprise implanting third dopants, through the top surface of the semiconductor body, to form the body region, and implanting fourth dopants, through the bottom of the trench, to form a region of the first conductivity type. In some examples, the third dopants and the fourth dopants may be implanted concurrently, such as in a blanket implantation of the third implantation process. In some examples, the region of the first conductivity type may correspond to part of the shielding region. In some examples, the body region overlies the first portion of the current spread region. In some examples, the region of the first conductivity type overlies the second portion of the current spread region (e.g., the region of the first conductivity type may be between the second portion of the current spread region and the gate structure.

In some examples, the third implantation process is performed before the trench is formed.

In some examples, the first portion of the current spread region is formed via an implantation process performed before the trench is formed (e.g., the implantation process may comprise implanting dopants through the top surface of the semiconductor body to form the first portion of the current spread region that has a vertical position matching a vertical position of the subsequently formed gate structure), and the second portion of the current spread region is formed via an implantation process performed after the trench is formed (e.g., the implantation process may comprise implanting dopants through the bottom of the trench to form the second portion of the current spread region that underlies the subsequently formed gate structure).

In an embodiment of the presently disclosed embodiments, a semiconductor device is provided. The semiconductor device may comprise a semiconductor body comprising a body region of the first conductivity type, a current spread region of the second conductivity type, and an implanted region (e.g., a shielding region) of the first conductivity type. The semiconductor device may comprise a trench gate structure, in the semiconductor body, comprising a gate electrode and a gate dielectric layer separating the gate electrode from the semiconductor body. The implanted region and the current spread region form a pn-junction. A vertical position of a first portion of the current spread region matches a vertical position of the trench gate structure and the first portion of the current spread region adjoins a first sidewall of the trench gate structure. A second portion of the current spread region underlies the trench gate structure. A difference between a first vertical distance and a second vertical distance is at most 200 nanometers, such as at most 100 nanometers, at most 50 nanometers, and/or at most 10 nanometers (and/or the first vertical distance may be about equal to the second vertical distance). The first vertical distance corresponds to a distance between a vertical position of a top side of the first portion of the current spread region and a vertical position of a top surface of the semiconductor body. The second vertical distance corresponds to a distance between a vertical position of a top side of the second portion of the current spread region and a vertical position of a bottom side of the trench gate structure.

In some examples, the semiconductor body comprises a semiconductor substrate, such as a SiC substrate. The semiconductor body may comprise one or more epitaxial layers overlying the semiconductor substrate. The one or more epitaxial layers may comprise a SiC epitaxial layer. The one or more epitaxial layers may be grown on the semiconductor substrate.

In some examples, the implanted region adjoins a second sidewall, of the trench gate structure, opposite the first sidewall of the trench gate structure.

In some examples, the top side of the first portion of the current spread region adjoins the body region.

FIGS. 1A-1G illustrate aspects with respect to manufacturing a semiconductor device according to various examples of the present disclosure. At 1001 (illustrated in FIG. 1A), a semiconductor body 102 is provided. The semiconductor body 102 may comprise crystalline semiconductor material. The semiconductor body 102 may comprise a semiconductor element (e.g., silicon, germanium, and/or other semiconductor element) and/or a semiconductor compound (e.g., SiC, silicon germanium (SiGe), gallium arsenide (GaAs), gallium nitride (GaN) and/or other semiconductor compound). In some examples, the semiconductor body 102 may comprise impurities (e.g., hydrogen, fluorine, oxygen and/or other impurities).

In some examples, the semiconductor body 102 comprises a semiconductor substrate, such as a SiC substrate. The semiconductor body 102 may comprise one or more epitaxial layers overlying the semiconductor substrate. The one or more epitaxial layers may comprise a SiC epitaxial layer. In some examples, an epitaxial layer (e.g., the SiC epitaxial layer) of the one or more epitaxial layers is grown on the semiconductor substrate. In some examples, the semiconductor device comprises a buffer layer between the semiconductor substrate and the one or more epitaxial layers. In some examples, the one or more epitaxial layers comprise multiple epitaxial layers (to form a super-junction of the semiconductor device, for example). In some examples, the semiconductor body 102 (e.g., the semiconductor substrate, the one or more epitaxial layers and/or the buffer layer) comprises dopants (e.g., nitrogen (N), phosphorus (P), beryllium (Be), boron (B), aluminum (Al), gallium (Ga) and/or other dopants). In an example, the semiconductor body 102 comprises n-type dopants, such as nitrogen dopants (and/or other n-type dopants).

At 1002 (illustrated in FIG. 1A), a first patterned mask layer 106 and/or a first screen layer 108 are formed over the semiconductor body 102. The first patterned mask layer 106 may comprise oxide material (e.g., silicon dioxide ($SiO_2$)) and/or one or more other materials. The first screen layer 108 (e.g., stray oxide layer) may comprise oxide material (e.g., $SiO_2$) and/or one or more other materials. A material composition of the first patterned mask layer 106 may be the same as or different than the first screen layer 108.

In some examples, a first mask layer (not shown), such as a hard mask, may be formed over the semiconductor body 102. The first mask layer may be structured (e.g., patterned) to form the first patterned mask layer 106 to have openings that expose portions of a top surface of the semiconductor body 102. The first screen layer 108 may be formed (after structuring the first mask layer to form the first patterned mask layer 106, for example) over the exposed portions of the top surface of the semiconductor body 102 and/or the first patterned mask layer 106, such that the exposed portions of the top surface of the semiconductor body 102 are covered by the first screen layer 108 (e.g., the exposed portions of the top surface of the semiconductor body 102 may correspond to portions of the top surface of the semiconductor body 102 that are laterally offset from portions of the first patterned mask layer 106 that are not removed via structuring the first mask layer). Portions 109A of the top surface of the semiconductor body 102 underlie (and/or are covered by) portions of the first patterned mask layer 106. Portions 109B of the top surface of the semiconductor body 102, that are not covered by the first patterned mask layer 106, may underlie (and/or may be covered by) at least the first screen layer 108.

In some examples, the first patterned mask layer 106 has a thickness 112 in the range of at least 1 micrometer to at most 10 micrometers, in the range of at least 2 micrometers to at most 4 micrometers, and/or in the range of at least 2.5 micrometers to at most 3.5 micrometers. In some examples, the first screen layer 108 has a thickness 110 in the range of at least 10 nanometers to at most 500 nanometers, and/or in the range of at least 25 nanometers to at most 75 nanometers.

At 1003 (illustrated in FIG. 1B), a first implantation process is performed to form one or more bury regions 116, of a first conductivity type, in the semiconductor body 102 (e.g., the one or more bury regions may comprise a first bury region 116A, a second bury region 116B, etc.). The first implantation process (e.g., an ion implantation process) may comprise implanting dopants, of the first conductivity type, through one or more portions of the top surface of the semiconductor body 102 that are laterally offset from portions of the first patterned mask layer 106. For example, by performing the first implantation process, the dopants may be implanted, through the first screen layer 108 and the portions 109B of the top surface of the semiconductor body 102 that are not covered by the first patterned mask layer 106, into the semiconductor body 102 to form the one or more bury regions 116. In an example, the first conductivity type is p-type (e.g., the one or more bury regions 116 may be one or more p-bury regions) and the dopants implanted via the first implantation process comprise p-type dopants, such as aluminum dopants, boron dopants, gallium dopants, beryllium dopants and/or other p-type dopants. In some examples, when the dopants are implanted via the first implantation process, the first screen layer 108 may scatter ion beams of the first implantation process, may mitigate and/or prevent channeling of implanted dopants (such that dopants do not penetrate deeper than a desired depth into the semiconductor body 102, for example), and/or may mitigate and/or prevent damage to the top surface of the semiconductor body 102 (e.g., the first screen layer 108 may mitigate and/or prevent damage that may otherwise be caused by ion beams of the first implantation process without the first screen layer 108).

In an example, the first implantation process may comprise one or more implantation shots in which ions, such as high-energy ions, are shot into the semiconductor body 102 via the first screen layer 108. In some examples, the one or more implantation shots comprise merely a single ion implantation shot (e.g., the one or more bury regions 116 may be formed by performing merely the single implantation shot). In some examples, a depth and/or concentration of dopants (of the first conductivity type) of the one or more bury regions 116 depends upon one or more parameters of the one or more implantation shots, such as an implantation energy level of the one or more implantation shots, an ion implantation dose of the one or more implantation shots and/or other parameter. In some examples, an implantation energy level of an implantation shot of the one or more implantation shots may be in the range of at least 100 kilo-electronvolts (keV) to at most 6,000 keV and/or in the range of at least 1,000 keV to at most 2,500 keV. In some examples, an implantation dose of the implantation shot may be in the range of at least $0.50 \times 10^{14}$ centimeters$^{-2}$ (cm$^{-2}$) to at most $3.50 \times 10^{14}$ cm$^{-2}$.

In some examples, after performing the first implantation process to form the one or more bury regions 116, the first patterned mask layer 106 and/or the first screen layer 108 may be removed. The first patterned mask layer 106 and/or the first screen layer 108 may be removed using an etching process, such as a dry etching process, a wet etching process, an anisotropic etching process, an isotropic etching process, and/or other suitable etching process. In an example, the etching process uses hydrogen chloride (HCl) (e.g., hydrochloric acid), hydrogen fluoride (HF) (e.g., hydrofluoric acid), and/or one or more other chemicals.

At 1004 (illustrated in FIG. 1B), a first patterned photoresist 120 and/or a second screen layer 122 are formed over the semiconductor body 102. The second screen layer 122 (e.g., stray oxide layer) may comprise oxide material (e.g., $SiO_2$) and/or one or more other materials. In some examples, the second screen layer 122 is formed over the semiconductor body 102, and the first patterned photoresist 120 may be formed over the second screen layer 122.

In some examples, a first photoresist (not shown) may be formed over the semiconductor body 102 (e.g., over the second screen layer 122). The first photoresist may be structured (e.g., patterned) to form the first patterned photoresist 120 to have openings that expose portions of the top surface of the semiconductor body 102. In some examples, the first photoresist comprises a light-sensitive material, where properties, such as solubility, of the first photoresist are affected by light. The first photoresist is a negative photoresist or a positive photoresist. In an example in which the first photoresist is a negative photoresist, regions of the first photoresist become insoluble when illuminated by a light source, such that application of a solvent to the first photoresist during a subsequent development stage removes non-illuminated regions of the first photoresist to form the first patterned photoresist 120. Accordingly, the first patterned photoresist 120 formed from the first photoresist (e.g., the negative photoresist) may correspond to a negative image of a pattern defined by opaque regions of a template, such as a mask, between the light source and the first photoresist. In an example in which the first photoresist is a positive photoresist, illuminated regions of the first photoresist become soluble and are removed via application of a solvent during development. Thus, the first patterned photoresist 120 formed from the first photoresist (e.g., the positive photoresist) may correspond to a positive image of opaque regions of the template, such as a mask, between the light source and the first photoresist.

One or more portions 117A of the top surface of the semiconductor body 102 underlie (and/or are covered by) one or more portions of the first patterned photoresist 120. In some examples, the one or more portions 117A may comprise border portions (e.g., edge portions) of the top surface of the semiconductor body 102. One or more portions 117B of the top surface of the semiconductor body 102, that are not covered by the first patterned photoresist 120, may underlie (and/or may be covered by) at least the second screen layer 122. In some examples, the one or more portions 117B may comprise a central portion, of the top surface of the semiconductor body 102, between border portions (e.g., edge portions) of the top surface of the semiconductor body 102.

In some examples, the second screen layer 122 has a thickness 126 in the range of at least 10 nanometers to at most 500 nanometers, and/or in the range of at least 25 nanometers to at most 75 nanometers.

At 1005 (illustrated in FIG. 1C), a second implantation process is performed to form a body region 130 (e.g., a channel region), of the first conductivity type, in the semiconductor body 102. The second implantation process (e.g., an ion implantation process) may comprise implanting dopants, of the first conductivity type, through one or more portions of the top surface of the semiconductor body 102 that are laterally offset from the first patterned photoresist 120. In an example, the second implantation process comprises a blanket implantation extending horizontally across at least a portion of the semiconductor body 102. For example, by performing the second implantation process, the dopants may be implanted, through the second screen layer 122 and the one or more portions 117B of the top surface of the semiconductor body 102 that are not covered by the first patterned photoresist 120, into the semiconductor body 102 to form the body region 130. In an example, the body region 130 may be a p-body region and the dopants implanted via the second implantation process comprise p-type dopants, such as aluminum dopants, boron dopants, gallium dopants, beryllium dopants and/or other p-type dopants. In some examples, when the dopants are implanted via the second implantation process, the second screen layer 122 may scatter ion beams of the second implantation process, may mitigate and/or prevent channeling of implanted dopants, and/or may mitigate and/or prevent damage to the top surface of the semiconductor body 102.

In an example, the second implantation process may comprise one or more implantation shots in which ions are shot into the semiconductor body 102 via the second screen layer 122. The one or more implantation shots may differ in their implantation energy level and/or their implantation dose.

In some examples, after performing the second implantation process to form the body region 130, the first patterned photoresist 120 and/or the second screen layer 122 may be removed. The first patterned photoresist 120 and/or the second screen layer 122 may be removed using an etching process.

At 1006 (illustrated in FIG. 1C), a second patterned mask layer 136 and/or a third screen layer 138 are formed over the semiconductor body 102. The second patterned mask layer 136 may comprise oxide material (e.g., $SiO_2$) and/or one or more other materials. The third screen layer 138 (e.g., stray oxide layer) may comprise oxide material (e.g., $SiO_2$) and/or one or more other materials. A material composition of the second patterned mask layer 136 may be the same as or different than the third screen layer 138.

In some examples, a second mask layer (not shown), such as a hard mask, may be formed over the semiconductor body 102. The second mask layer may be structured (e.g., patterned) to form the second patterned mask layer 136 to have openings that expose portions of a top surface of the semiconductor body 102. The third screen layer 138 may be formed (after structuring the second mask layer to form the second patterned mask layer 136, for example) over the exposed portions of the top surface of the semiconductor body 102 and/or the second patterned mask layer 136, such that the exposed portions of the top surface of the semiconductor body 102 are covered by the third screen layer 138 (e.g., the exposed portions of the top surface of the semiconductor body 102 may correspond to portions of the top surface of the semiconductor body 102 that are laterally offset from portions of the second patterned mask layer 136 that are not removed via structuring the second mask layer). Portions 139A of the top surface of the semiconductor body 102 underlie (and/or are covered by) portions of the second patterned mask layer 136. Portions 139B of the top surface of the semiconductor body 102, that are not covered by the second patterned mask layer 136, may underlie (and/or may be covered by) at least the third screen layer 138.

In some examples, the second patterned mask layer 136 has a thickness 140 in the range of at least 1 micrometer to at most 10 micrometers, in the range of at least 2 micrometers to at most 4 micrometers, and/or in the range of at least 2.5 micrometers to at most 3.5 micrometers. In some examples, the third screen layer 138 has a thickness 142 in the range of at least 10 nanometers to at most 500 nanometers, and/or in the range of at least 25 nanometers to at most 75 nanometers.

At 1007 (illustrated in FIG. 1D), a third implantation process is performed to form one or more regions 146, of the first conductivity type, in the semiconductor body 102 (e.g., the one or more regions 146 may comprise a first region 146A, a second region 146B, etc.). The third implantation process (e.g., an ion implantation process) may comprise implanting dopants, of the first conductivity type, through one or more portions of the top surface of the semiconductor body 102 that are laterally offset from portions of the second patterned mask layer 136. For example, by performing the third implantation process, the dopants may be implanted, through the third screen layer 138 and the portions 139B of the top surface of the semiconductor body 102 that are not covered by the second patterned mask layer 136, into the semiconductor body 102 to form the one or more regions 146. In an example, the one or more regions 146 may be one or more p-top regions and the dopants implanted via the third implantation process comprise p-type dopants, such as aluminum dopants, boron dopants, gallium dopants, beryllium dopants and/or other p-type dopants. In some examples, when the dopants are implanted via the third implantation process, the third screen layer 138 may scatter ion beams of the third implantation process, may mitigate and/or prevent channeling of implanted dopants, and/or may mitigate and/or prevent damage to the top surface of the semiconductor body 102.

In an example, the third implantation process may comprise one or more implantation shots in which ions are shot into the semiconductor body 102 via the third screen layer 138. The one or more implantation shots may differ in their implantation energy level and/or their implantation dose.

In some examples, after performing the third implantation process to form the one or more regions 146, the second patterned mask layer 136 and/or the third screen layer 138 may be removed. The second patterned mask layer 136 and/or the third screen layer 138 may be removed using an etching process.

At 1008 (illustrated in FIG. 1D), a second patterned photoresist 150 and/or a fourth screen layer 152 are formed over the semiconductor body 102. The fourth screen layer 152 (e.g., stray oxide layer) may comprise oxide material (e.g., $SiO_2$) and/or one or more other materials. In some examples, the fourth screen layer 152 is formed over the semiconductor body 102, and the second patterned photoresist 150 may be formed over the fourth screen layer 152.

In some examples, a second photoresist (not shown) may be formed over the semiconductor body 102 (e.g., over the fourth screen layer 152). The second photoresist may be structured (e.g., patterned) to form the second patterned photoresist 150 to have openings that expose portions of the top surface of the semiconductor body 102. Portions 151A of the top surface of the semiconductor body 102 underlie (and/or are covered by) portions of the second patterned photoresist 150. Portions 151B of the top surface of the semiconductor body 102, that are not covered by the second patterned photoresist 150, may underlie (and/or may be covered by) at least the fourth screen layer 152.

In some examples, the fourth screen layer 152 has a thickness 156 in the range of at least 10 nanometers to at most 500 nanometers, and/or in the range of at least 25 nanometers to at most 75 nanometers.

At 1009 (illustrated in FIG. 1E), a fourth implantation process is performed to form one or more source regions 160, of a second conductivity type different than the first conductivity type, in the semiconductor body 102 (e.g., the one or more source regions 160 may comprise at least one of a first source region 160A, a second source region 160B, a third source region 160C, etc.). The fourth implantation process (e.g., an ion implantation process) may comprise implanting dopants, of the second conductivity type, through one or more portions of the top surface of the semiconductor body 102 that are laterally offset from the second patterned photoresist 150. For example, by performing the fourth implantation process, the dopants may be implanted, through the fourth screen layer 152 and the portions 151B of the top surface of the semiconductor body 102 that are not covered by the second patterned photoresist 150, into the semiconductor body 102 to form the one or more source regions 160. In some examples, the second conductivity type is n-type (e.g., the one or more source regions may be n+ source regions). The dopants implanted via the fourth implantation process may comprise n-type dopants, such as nitrogen dopants, phosphorus dopants and/or other n-type dopants. In some examples, when the dopants are implanted via the fourth implantation process, the fourth screen layer 152 may scatter ion beams of the fourth implantation process, may mitigate and/or prevent channeling of implanted dopants, and/or may mitigate and/or prevent damage to the top surface of the semiconductor body 102.

In an example, the fourth implantation process may comprise one or more implantation shots in which ions are shot into the semiconductor body 102 via the fourth screen layer 152. The one or more implantation shots may differ in their implantation energy level and/or their implantation dose.

In some examples, after performing the fourth implantation process to form the one or more source regions 160, the second patterned photoresist 150 and/or the fourth screen layer 152 may be removed. The second patterned photoresist 150 and/or the fourth screen layer 152 may be removed using an etching process.

At 1010 (illustrated in FIG. 1E), a third patterned mask layer 166 is formed over the semiconductor body 102. The third patterned mask layer 166 may comprise oxide material (e.g., $SiO_2$) and/or one or more other materials. In some examples, a third mask layer (not shown), such as a hard mask, may be formed over the semiconductor body 102. The third mask layer may be structured (e.g., patterned) to form the third patterned mask layer 166 to have openings that expose portions of the top surface of the semiconductor body 102. Portions 167A of the top surface of the semiconductor body 102 underlie (and/or are covered by) portions of the third patterned mask layer 166. Portions 167B of the top surface of the semiconductor body 102 are not covered by the third patterned mask layer 166.

In some examples, the third patterned mask layer 166 has a thickness 164 in the range of at least 100 nanometers to at most 10 micrometers, in the range of at least 2 micrometers to at most 4 micrometers, and/or in the range of at least 2.5 micrometers to at most 3.5 micrometers.

At 1011 (illustrated in FIG. 1F), one or more trenches 170 are formed in the semiconductor body 102 (e.g., the one or more trenches may comprise at least one of a first trench 170A, a second trench 170B, etc.). The one or more trenches 170 may be formed using the third patterned mask layer 166. In some examples, an etching process is performed to form the trenches 170, where openings in the third patterned mask layer 166 allow one or more etchants applied during the etching process to remove portions of the semiconductor body 102 while the third patterned mask layer 166 protects or shields portions of the semiconductor body 102 that are covered by the third patterned mask layer 166. The etching process is a dry etching process, a wet etching process, an anisotropic etching process, an isotropic etching process, and/or other suitable etching process. In an example, the etching process uses hydrogen chloride (e.g., hydrochloric acid), hydrogen fluoride (e.g., hydrofluoric acid), and/or one or more other chemicals.

In some examples, a trench (e.g., the first trench 170A, the second trench 170B, etc.) of the one or more trenches 170 may be formed to have a rounded corner 174. The rounded corner 174 may be formed via hydrogen (e.g., $H_2$) treatment. Alternatively and/or additionally, a trench (e.g., the first trench 170A, the second trench 170B, etc.) of the one or more trenches 170 may be formed such that a sidewall 172, of the semiconductor body 102, defining the trench is tapered at an angle 176 with respect to an axis 173. The axis 173 may correspond to an axis along which the top surface of the semiconductor body 102 extends. In some examples, the angle 176 may be less than 90 degrees. For example, the angle 176 may be in the range of at least 83 degrees to at most 89 degrees, such as about 86 degrees. In an example, at least a portion of the sidewall 172 extends along a c-axis 175 of the semiconductor body 102 (e.g., the c-axis 175 may correspond to a crystallographic c-axis of material, such as SiC, of the semiconductor body 102).

In some examples, after forming the one or more trenches 170, the third patterned mask layer 166 may be removed. The third patterned mask layer 166 may be removed using an etching process.

In some examples, a first annealing process (e.g., a low temperature annealing process) may be performed. The first annealing process may prevent and/or mitigate wafer bow of the semiconductor body. The first annealing process may be performed prior to forming the one or more trenches 170 and/or after performing the first implantation process, the second implantation process, the third implantation process and/or the fourth implantation process.

At 1012 (illustrated in FIG. 1F), a third patterned photoresist 184 is formed over the semiconductor body 102. In some examples, a third photoresist (not shown) may be formed over the semiconductor body 102. The third photoresist may be structured (e.g., patterned) to form the third patterned photoresist 184. One or more portions 185A of the top surface of the semiconductor body 102 underlie (and/or are covered by) one or more portions of the third patterned photoresist 184. In some examples, the one or more portions 185A may comprise border portions (e.g., edge portions) of the top surface of the semiconductor body 102. One or more portions 185B of the top surface of the semiconductor body 102 are not covered by the third patterned photoresist 184. In some examples, the one or more portions 185B of the top surface of the semiconductor body 102 may underlie (and/or may be covered by) a screen layer (not shown), such as a screen layer (e.g., a stray oxide layer) formed using one or more of the techniques provided herein with respect to the first screen layer 108, the second screen layer 122, the third screen layer 138 and/or the fourth screen layer 152. Alternatively and/or additionally, the one or more portions 185B of the top surface of the semiconductor body 102 may be exposed. In some examples, the one or more portions 185B may comprise a central portion, of the top surface of the semiconductor body 102, between border portions (e.g., edge portions) of the top surface of the semiconductor body 102.

At 1013 (illustrated in FIG. 1G), a fifth implantation process is performed to form one or more current spread regions, of the second conductivity type, in the semiconductor body 102. The fifth implantation process (e.g., an ion implantation process) may comprise implanting dopants, of the second conductivity type, through the top surface of the semiconductor body 102 (e.g., through one or more portions of the top surface of the semiconductor body 102 that are laterally offset from the third patterned photoresist 184) and implanting dopants, of the second conductivity type, through bottoms of the one or more trenches 170. The dopants implanted via the fifth implantation process may comprise n-type dopants, such as nitrogen dopants, phosphorus dopants and/or other n-type dopants. In an example, the fifth implantation process comprises a blanket implantation extending horizontally across at least a portion of the semiconductor body 102. In an example in which there is a screen layer (not shown) over the top surface of the semiconductor body 102 and/or in the one or more trenches 170, when the dopants are implanted via the fifth implantation process, the screen layer may scatter ion beams of the fifth implantation process, may mitigate and/or prevent channeling of implanted dopants, and/or may mitigate and/or prevent damage to the top surface of the semiconductor body 102.

Figure 1G:
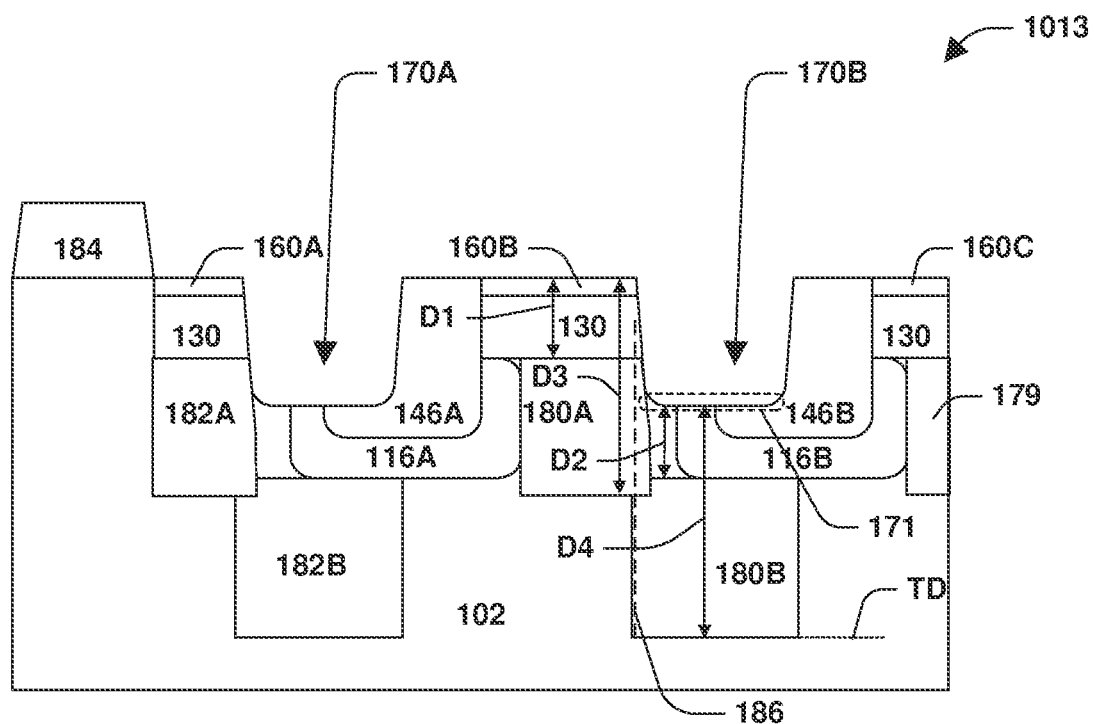
FIG. 1G schematically illustrates acts of manufacturing a semiconductor device according to various examples.
Figure 1G:
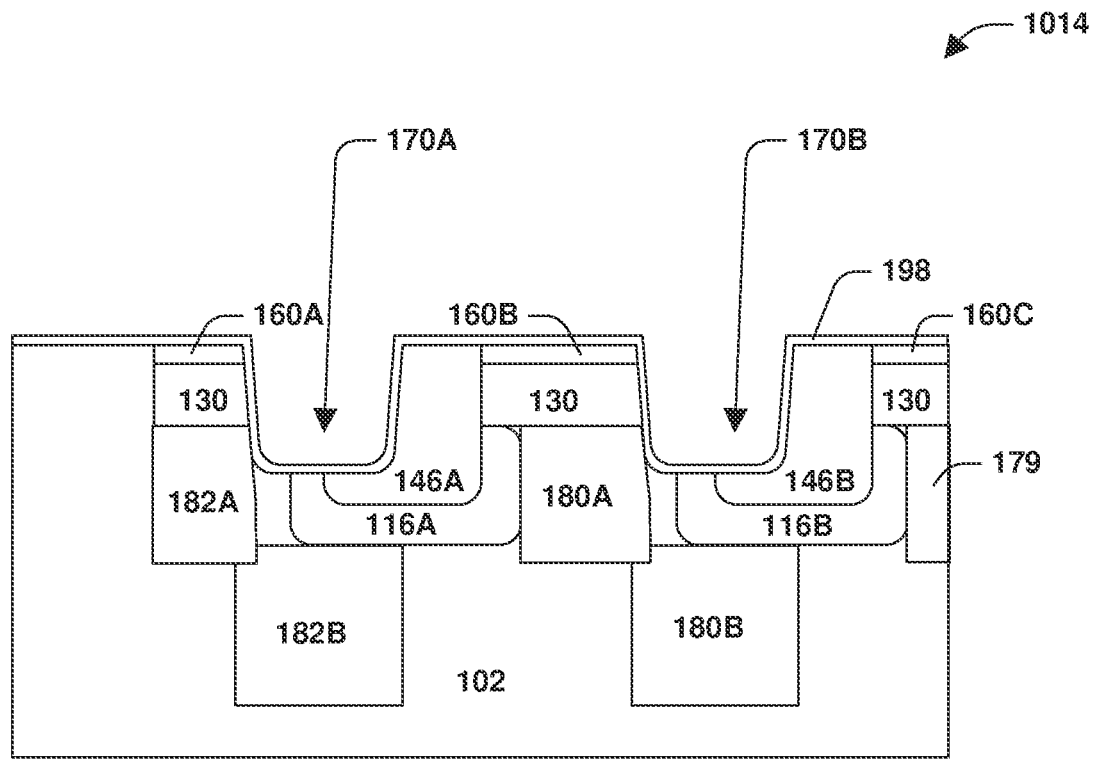

In an example, the one or more current spread regions may comprise at least one of a first current spread region 182, a second current spread region 180, a third current spread region 179 (e.g., merely a part of which is shown in FIG. 1G), etc. In some examples, one, some and/or all of the one or more current spread regions have similar characteristics as each other and/or are identical and/or equivalent to each other.

In some examples, each current spread region of one, some and/or all of the one or more current spread regions formed in the semiconductor body 102 comprises: (i) a first portion (e.g., a first portion 182A of the first current spread region 182, a first portion 180A of the second current spread region 180, etc.) that has a vertical position matching a vertical position of a trench of the one or more trenches 170; and (ii) a second portion (e.g., a second portion 182B of the first current spread region 182, a second portion 180B of the second current spread region 180, etc.) that underlies a trench of the one or more trenches 170. In some examples, the fifth implantation process comprises implanting first dopants, through the top surface of the semiconductor body 102, to form the first portion of each current spread region of one, some and/or all of the one or more current spread regions formed in the semiconductor body 102 (e.g., the first portion 182A of the first current spread region 182, the first portion 180A of the second current spread region 180, etc. may be formed via implanting the first dopants through the top surface of the semiconductor body 102). In some examples, the fifth implantation process comprises implanting second dopants, through bottoms of the one or more trenches 170 of the semiconductor body 102, to form the second portion of each current spread region of one, some and/or all of the one or more current spread regions formed in the semiconductor body 102 (e.g., the second portion 182B of the first current spread region 182, the second portion 180B of the second current spread region 180, etc. may be formed via implanting the second dopants through the bottoms of the one or more trenches 170). The first dopants and the second dopants may be implanted (via one or more implantation shots of the fifth implantation process, for example) concurrently, such as simultaneously. For example, the first dopants and the second dopants may be implanted via a blanket implantation of the fifth implantation process.

In an example, dopants are implanted through the top surface of the semiconductor body 102 to form the first portion 180A of the second current spread region 180 and dopants are implanted through a bottom 171 of the second trench 170B (and/or one or more sidewalls of the semiconductor body 102 defining the second trench 170B) to form the second portion 180B of the second current spread region 180. The first portion 180A of the second current spread region 180 may have a vertical position matching a vertical position of the second trench 170B (e.g., a vertical position of at least some of the first portion 180A of the second current spread region 180 matches a vertical position of at least some of the second trench 170B). The second portion 180B of the second current spread region 180 may underlie the second trench 170B.

In some examples, a difference between a first vertical distance D1 and a second vertical distance D2 is at most 200 nanometers, such as at most 100 nanometers, at most 50 nanometers, and/or at most 10 nanometers (and/or the first vertical distance D1 may be about equal to the second vertical distance D2). The first vertical distance D1 corresponds to a distance between a vertical position of the top surface of the semiconductor body 102 (through which dopants are implanted in the fifth implantation process to form the first portion 180A of the second current spread region 180) and a vertical position of a top side of the first portion 180A of the second current spread region 180. The second vertical distance D2 corresponds to a distance between a vertical position of a bottom of the second trench 170B (through which dopants are implanted in the fifth implantation process to form the second portion 180B of the second current spread region 180) and a vertical position of a top side of the second portion 180B of the second current spread region 180. In some examples, the first vertical distance D1 and the second vertical distance D2 may be based upon one or more parameters of the fifth implantation process, such as based on a minimum implantation energy level of the fifth implantation process (e.g., the minimum implantation energy level may correspond to a lowest implantation energy level used in the fifth implantation process). In an example, the first vertical distance D1 and the second vertical distance D2 may be a function of the minimum implantation energy level, such as where an increase of the minimum implantation energy level results in an increase of the first vertical distance D1 and an increase of the second vertical distance D2. Accordingly, vertical positions of the top side of the first portion 180B of the second current spread region 180 may be controlled 180A and the top side of the second via selection of the minimum implantation energy level. In some examples, one or more parameters of the fifth implantation process (e.g., the minimum implantation energy level) and/or a depth of the second trench 170B may be selected such that a vertical position of the first portion 180A of the second current spread region 180 matches a vertical position of the second trench 170B (e.g., such that the top side of the first portion 180A of the second current spread region 180 is higher than the bottom 171 of the second trench 170B). Alternatively and/or additionally, the one or more parameters of the fifth implantation process (e.g., the minimum implantation energy level) may be selected such that the top side of the first portion 180A of the second current spread region 180 adjoins the body region 130. In some examples, the one or more parameters may comprise a quantity of ion implantation shots, an implantation energy level, and/or an ion implantation dose.

In some examples, a difference between a third vertical distance D3 and a fourth vertical distance D4 is at most 200 nanometers, such as at most 100 nanometers, at most 50 nanometers, and/or at most 10 nanometers (and/or the third vertical distance D3 may be about equal to the fourth vertical distance D4). The third vertical distance D3 corresponds to a distance between a vertical position of the top surface of the semiconductor body 102 (through which dopants are implanted in the fifth implantation process to form the first portion 180A of the second current spread region 180) and a vertical position of a bottom side of the first portion 180A of the second current spread region 180. The fourth vertical distance D4 corresponds to a distance between a vertical position of a bottom 171 of the second trench 170B (through which dopants are implanted in the fifth implantation process to form the second portion 180B of the second current spread region 180) and a vertical position of a bottom side of the second portion 180B of the second current spread region 180. In some examples, the third vertical distance D3 and the fourth vertical distance D4 may be based upon an implantation energy level of an implantation shot of the fifth implantation process, such as based on a maximum implantation energy level of the fifth implantation process (e.g., the maximum implantation energy level may correspond to a highest implantation energy level used in the fifth implantation process). In an example, the third vertical distance D3 and the fourth vertical distance D4 may be a function of the maximum implantation energy level, such as where an increase of the maximum implantation energy level results in an increase of the third vertical distance D3 and an increase of the fourth vertical distance D4. Accordingly, vertical positions of the bottom side of the first portion 180A and the bottom side of the second portion 180B of the second current spread region 180 may be controlled via selection of the maximum implantation energy level. In some examples, one or more parameters of the fifth implantation process (e.g., the maximum implantation energy level) and/or the depth of the second trench 170B may be selected such that a vertical position of the bottom side of the first portion 180A of the second current spread region 180 is lower than the bottom 171 of the second trench 170B. In this way, the first portion 180A of the second current spread region 180 may extend from a vertical position that is higher than the bottom 171 of the second trench 170B to a vertical position that is lower than the bottom 171 of the second trench 170B. Alternatively and/or additionally, the one or more parameters of the fifth implantation process (e.g., the maximum implantation energy level) and/or the depth of the second trench 170B may be selected such that a vertical position of the bottom side of the first portion 180A of the second current spread region 180 is lower than or equal to a vertical position of the top side of the second portion 180B of the second current spread region 180. Alternatively and/or additionally, the one or more parameters of the fifth implantation process (e.g., the maximum implantation energy level) and/or the depth of the second trench 170B may be selected such that a doping concentration of the second conductivity type (e.g., n-type doping concentration) along a line 186 (e.g., a vertical line) that extends through the first portion 180A and the second portion 180B of the second current spread region 180 satisfies a condition. The condition may be that along the line 186, the doping concentration (e.g., concentration of n-type dopants) through the first portion 180A and the second portion 180B of the second current spread region 180 has a variance that is less than a threshold variance. Alternatively and/or additionally, the condition may be that among doping concentrations (e.g., n-type doping concentrations), along the line 186, in the first portion 180A and the second portion 180B of the second current spread region 180, a maximum doping concentration concentration$_{max}$ of the doping concentrations and a minimum doping concentration concentration$_{min}$ satisfy the following:

$$\frac{\text{concentration}_{max}}{\text{concentration}_{min}} \leq \text{thresh},$$

where thresh may be 5, 10, or other value.

In an example, the fifth implantation process may comprise one or more implantation shots in which ions are shot into the semiconductor body 102 to form the one or more current spread regions (e.g., the ions are shot, into the semiconductor body 102, through the top surface of the semiconductor body 102 and/or through bottoms of the one or more trenches 170). The one or more implantation shots may differ in their implantation energy level and/or their implantation dose.

In some examples, the maximum implantation energy level of the fifth implantation process (e.g., the maximum implantation energy level of the one or more implantation shots of the fifth implantation process used to form the one or more current spread regions) may be at most 2,000 keV, such as at most 1,800 keV and/or at most 1,500 keV. The fifth implantation process may be performed such that implanted dopants, underlying a trench 170, reaches a target depth TD that is lower than the vertical position of a bottom of the trench 170. In some implementations in which the one or more current spread regions are formed via an implantation process performed before the one or more trenches 170 are formed, a required maximum implantation energy level of the implantation process may exceed the maximum implantation energy level of the fifth implantation process (e.g., the required maximum implantation energy level of the implantation process may be more than 2,000 keV, such as up to 3,000 keV and/or up to 4,000 keV) in order to implant dopants deep enough to reach the target depth TD. Accordingly, using the techniques provided herein to perform the fifth implantation process (and/or to form at least a portion of the one or more current spread regions) after the one or more trenches 170 are formed (rather than before the one or more trenches 170 are formed, for example), the one or more current spread regions may be formed with a lower maximum implantation energy level (e.g., implanted dopants of the second conductivity type may reach the target depth TD with the lower maximum implantation energy level). Alternatively and/or additionally, using the techniques provided herein to perform the fifth implantation process (and/or to form at least a portion of the one or more current spread regions) after the one or more trenches 170 are formed (rather than before the one or more trenches 170 are formed, for example), deeper implants may be achieved with the same maximum implantation energy level as implementations in which the one or more current spread regions are formed prior to forming the one or more trenches 170.

Forming the one or more current spread regions with the lower maximum implantation energy level may provide for a thinner required thickness of a photoresist and/or a hard mask used for performing the fifth implantation process to form the one or more current spread regions. For example, the third patterned photoresist 184 used for implanting dopants to form the one or more current spread regions may be thinner as compared to implementations in which the one or more current spread regions are formed before the one or more trenches are formed. In an example, a thickness of the third patterned photoresist 184 may be in the range of at least 0.5 micrometers to at most 2 micrometers, whereas, implementations in which the one or more current spread regions are formed before the one or more trenches are formed may require a photoresist thickness of between 4 micrometers and 6 micrometers. Alternatively and/or additionally, the third patterned photoresist 184 may be replaced with a patterned hard mask, such as an oxide mask comprising $SiO_2$, having a thickness that is in the range of at least 0.5 micrometers to at most 2 micrometers.

Alternatively and/or additionally, forming the one or more current spread regions with the lower maximum implantation energy level may provide for: (i) reduced power consumption for forming the one or more current spread regions; (ii) increased ion flux and/or reduced implantation time; and/or (iii) enabling a larger variety of dopant implanting tools to be used to perform the fifth implantation process to form the one or more current spread regions (e.g., since the maximum implantation energy level is lower, there are more dopant implanting tools available that are capable of performing a implantation shot with the maximum implantation energy level), thereby improving tool redundancy.

Alternatively and/or additionally, by forming the one or more current spread regions using one or more of the techniques provided herein, a quantity of ion implantation shots of the one or more ion implantation shots of the fifth implantation process may be reduced as compared to a quantity of ion implantation shots performed to form the one or more current spread regions in implementations in which the ion implantation shots are performed before the one or more trenches 170 are formed. In an example, the quantity of ion implantation shots of the one or more ion implantation shots of the fifth implantation process may be three, whereas, in implementations in which ion implantation shots to form the one or more current spread regions are performed before the one or more trenches 170 are formed, a quantity of the ion implantation shots may be greater than three, such as five, six, seven, etc. The reduced quantity of ion implantation shots performed to form the one or more current spread regions may result in a reduction in an amount of time it takes to implant dopants to form the one or more current spread regions, a reduction in an amount of power used to form the one or more current spread regions, and/or a reduction in an amount of work performed by implantation equipment used to form the one or more current spread regions.

In some examples, one or more ion implantation shots of the fifth implantation process may be performed in one or more channeling directions associated with channeling implants into the semiconductor body 102. In comparison with performing the one or more ion implantation shots in a direction that is perpendicular to the top surface of the semiconductor body 102, performing the one or more ion implantation shots along the one or more channeling directions may result in lower implantation energy levels being required for implanted dopants to reach desired depths (e.g., the one or more ion implantation shots may be performed with lower energy due to being performed using the one or more channeling directions). Accordingly, in some examples, an implantation angle of an ion implantation shot of the one or more ion implantation shots may be based upon a channeling direction of the one or more channeling directions. In an example, the one or more channeling directions comprise a channeling direction of 0 degrees relative to the c-axis 175 (shown in FIG. 1F) of the semiconductor body 102, wherein the one or more ion implantation shots may comprise an implantation shot performed with an implantation angle (e.g., a tilt) corresponding to the channeling direction of 0 degrees (e.g., the implantation angle may be −4 degrees relative to an axis perpendicular to the top surface of the semiconductor body 102). In an example, the one or more channeling directions comprise a channeling direction of 17 degrees relative to the c-axis 175 of the semiconductor body 102, wherein the one or more ion implantation shots may comprise an implantation shot performed with an implantation angle corresponding to the channeling direction of 17 degrees (e.g., the implantation angle may be 13 degrees relative to the axis perpendicular to the top surface of the semiconductor body 102).

In some examples, after performing the fifth implantation process to form the one or more current spread regions, the third patterned photoresist 184 may be removed. The third patterned photoresist 184 may be removed using an etching process.

At 1014 (illustrated in FIG. 1G), a capping layer 198 is formed over the semiconductor body 102 and/or a second annealing process (e.g., a high temperature annealing process) is performed. The capping layer 198 may comprise graphite and/or other material. The capping layer 198 may be formed before performing the second annealing process. The second annealing process may comprise heating the semiconductor body 102 to activate dopants in the semiconductor body 102 (e.g., the dopants may comprise dopants implanted via the first implantation process, the second implantation process, the third implantation process, the fourth implantation process and/or the fifth implantation process). For example, the second annealing process may cause the dopants to become electrically activated. In some examples, the capping layer 198 may prevent out-diffusion of implanted dopants during the second annealing process (e.g., the capping layer 198 may prevent dopants from escaping the semiconductor body 102 during the second annealing process). In some examples, a temperature used to perform the second annealing process is higher than a temperature used to perform the first annealing process. In some examples, the capping layer 198 may be removed (e.g., via an etching process and/or using one or more other techniques) after performing the second annealing process.

Figure 1H:
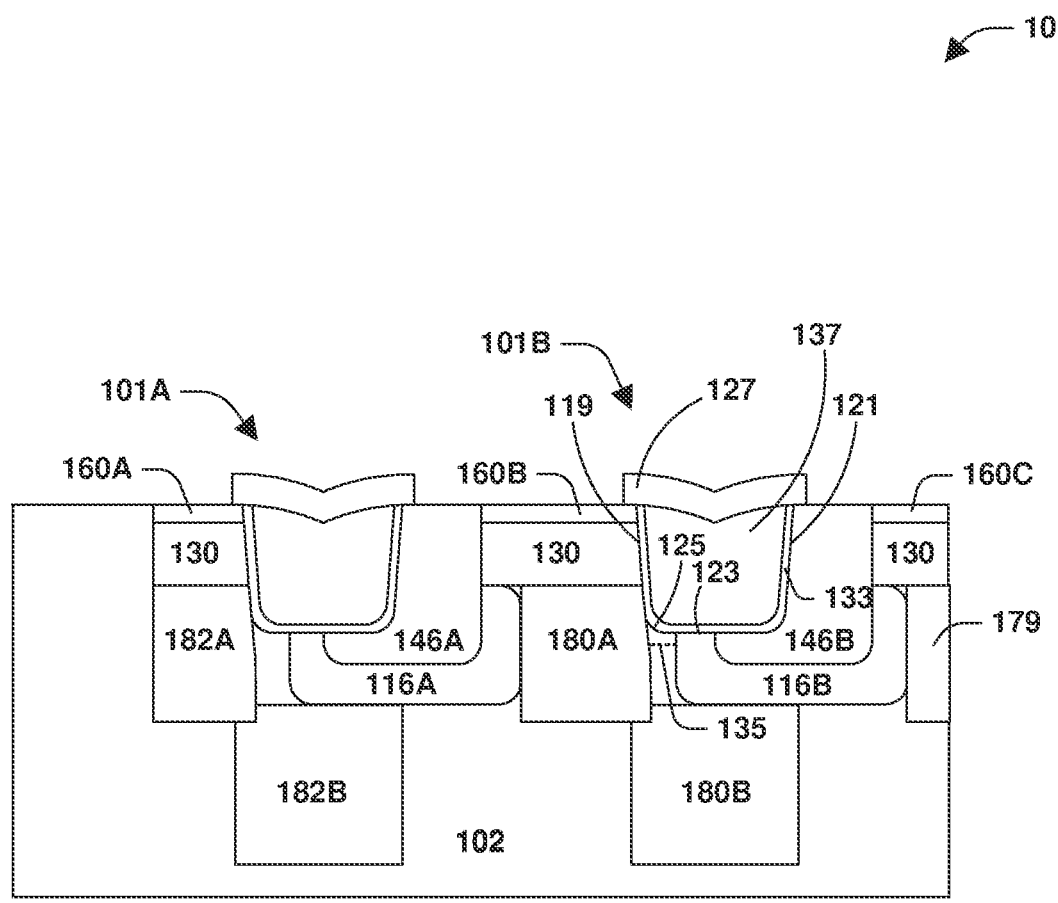
FIG. 1H schematically illustrates acts of manufacturing a semiconductor device according to various examples.

At 1015 (illustrated in FIG. 1H), one or more gate structures 101 are formed in the one or more trenches 170. For example, the one or more gate structures 101 may comprise at least one of a first gate structure 101A formed in the first trench 170A, a second gate structure 101B formed in the second trench 170B, etc. In some examples, a gate dielectric layer 133 may be formed in each trench of one, some and/or all of the one or more trenches 170, and/or a gate electrode 137 may be formed in each trench of one, some and/or all of the one or more trenches 170, wherein the gate dielectric layer 133 separates the gate electrode 137 from the semiconductor body 102. In some examples, the gate dielectric layer 133 may comprise oxide material (e.g., $SiO_2$) and/or one or more other materials. In some examples, the gate electrode 137 may comprise one or more doped semiconductor materials, one or more metals and/or one or more other materials. In some examples, a dielectric layer 127 (e.g., an interlayer dielectric) may be formed over the gate electrode 137, wherein the dielectric layer 127 may electrically insulate the gate electrode 137 from one or more conductive elements of at least one of wiring, interconnection components, etc. (that are over the semiconductor body 102, for example).

In some examples, a vertical position of the first portion 180A of the second current spread region 180 matches a vertical position of the second gate structure 101B comprising the gate dielectric layer 133 and/or the gate electrode 137 (e.g., a vertical position of at least some of the first portion 180A of the second current spread region 180 matches a vertical position of at least some of the second gate structure 101B). Alternatively and/or additionally, the second portion 180B of the second current spread region 180 may underlie the second gate structure 101B.

In some examples, the first portion 180A of the second current spread region 180 adjoins a first sidewall 119 of the second gate structure 101B. In some examples, the second source region 160B (at least a portion of which overlies the first portion 180A of the second current spread region 180, for example) and/or the body region 130 (at least a portion of which overlies the first portion 180A of the second current spread region 180, for example) adjoin the first sidewall 119 of the second gate structure 101B. In some examples, the first sidewall 119 of the second gate structure 101B corresponds to a portion of a surface of the gate dielectric layer 133 in the second gate structure 101B.

In some examples, the second region 146B (e.g., a p-top region) and/or the second bury region 116B adjoin a bottom side 123 of the second gate structure 101B. In some examples, the second gate structure 101B, the second region 146B and/or the second bury region 116B are positioned such that the second region 146B and/or the second bury region 116B do not adjoin (and/or do not extend to) a corner 125 of the second gate structure 101B (e.g., a corner of the second gate structure 101B that is between the first sidewall of the second gate structure 101B and the bottom side 123 of the second gate structure 101B). In some examples, the second region 146B and the second bury region 116B correspond to a shielding region. The shielding region (comprising the second region 146B and the second bury region 116B, for example) may provide shielding of the second gate structure 101B (e.g., the shielding region may provide shielding of the gate dielectric layer 133 in the second gate structure 101B). In some examples, a measure of shielding provided to the second gate structure 101B (and/or to the gate dielectric layer 133) by the shielding region (e.g., the shielding region may shield the second gate structure 101B from electric fields) may depend upon a horizontal distance 135 between a horizontal position of the shielding region and a horizontal position of the corner 125. Alternatively and/or additionally, Ron.A of the semiconductor device may depend upon the horizontal distance 135. For example, a decrease of the horizontal distance 135 may be associated with an increase of the measure of shielding and/or an increase of Ron.A. For example, the second gate structure 101B, the second region 146B and/or the second bury region 116B may be positioned to achieve a desired amount of shielding to the second gate structure 101B and/or to achieve a desired Ron.A. In an example, the second gate structure 101B, the second region 146B and/or the second bury region 116B may be positioned such that the horizontal distance 135 is larger than a threshold distance (e.g., the horizontal distance 135 being less than or equal to the threshold distance may result in the semiconductor device having a Ron.A that is too high for the semiconductor device to function correctly).

In some examples, the second region 146B (e.g., the p-top region) adjoins a second sidewall 121 of the second gate structure 101B, wherein the second sidewall 121 is opposite the first sidewall 119 of the second gate structure 101B.

In some examples, a first contact, a second contact and/or a third contact (not shown) may be formed. The first contact may be a source contact and/or may be connected (e.g., electrically connected) to the second source region 160B. The second contact may be connected (e.g., electrically connected) to the shielding region, such as to the second region 146B (e.g., the p-top region). The third contact may be a drain contact and/or may be connected (e.g., electrically connected) to a second surface of the semiconductor body 102, such as a bottom surface (e.g., a backside) of the semiconductor body 102 that is opposite the top surface of the semiconductor body.

In some examples, the first contact, the second contact and/or the third contact may be contacts of a transistor, such as a field-effect transistor (FET), a metal-oxide-semiconductor FET (MOSFET), an insulated-gate bipolar transistor (IGBT) and/or other type of transistor of the semiconductor device. In some examples, the body region 130 defines a channel of the transistor, such as a channel between the second source region 160B and the second current spread region 180. In an example, the transistor is a MOSFET (e.g., a vertical MOSFET) and the channel (defined by the body region 130) is a MOSFET channel of the MOSFET. In some examples, a conductivity of the channel is controlled by a voltage applied to the gate electrode 137. In some examples, a breakdown voltage of the transistor depends upon a thickness and/or a doping concentration of an epitaxial layer (e.g., a SiC epitaxial layer) of the one or more epitaxial layers of the semiconductor body 102. In some examples, the one or more bury regions 116, the body region 130, the one or more regions 146 (e.g., the one or more p-top regions), the one or more source regions 160 and/or the one or more current spread regions are regions of the epitaxial layer (e.g., the SiC epitaxial layer).

In some examples, the shielding region (and/or the second region 146B and/or the second bury region 116B) and the second current spread region 180 form a pn-junction. The pn-junction may form a body diode of the semiconductor device, such as a body diode that conducts current from the shielding region (and/or from other p-doped region of the semiconductor device) to the second current spread region 180 (and/or to other n-doped region of the semiconductor device). In some examples, current flows through the second current spread region 180 to a drain of the transistor, such as to a drain contact of the semiconductor device. In some examples, the drain contact is formed on a surface of the semiconductor device, such as a backside of the semiconductor device (e.g., the backside of the semiconductor device may correspond to a surface, of the semiconductor body 102, opposite the top surface of the semiconductor body 102, such as where the backside corresponds to a bottom side of the semiconductor substrate of the semiconductor body 102). The pn-junction may correspond to a junction between p-doped region (e.g., the shielding region) and n-doped region (e.g., the second current spread region 180 and/or other n-doped region of the semiconductor body 102).

In some examples, the one or more current spread regions of the semiconductor device may provide a connection (e.g., a low-resistive connection) between a channel (e.g., a MOSFET channel defined by the body region 130) and an epitaxial layer (e.g., a SiC epitaxial layer) of the one or more epitaxial layers of the semiconductor body 102. Alternatively and/or additionally, current may be spread across the one or more current spread regions of the semiconductor device (e.g., the one or more current spread regions may spread the current over the width of the transistor).

Figure 2:
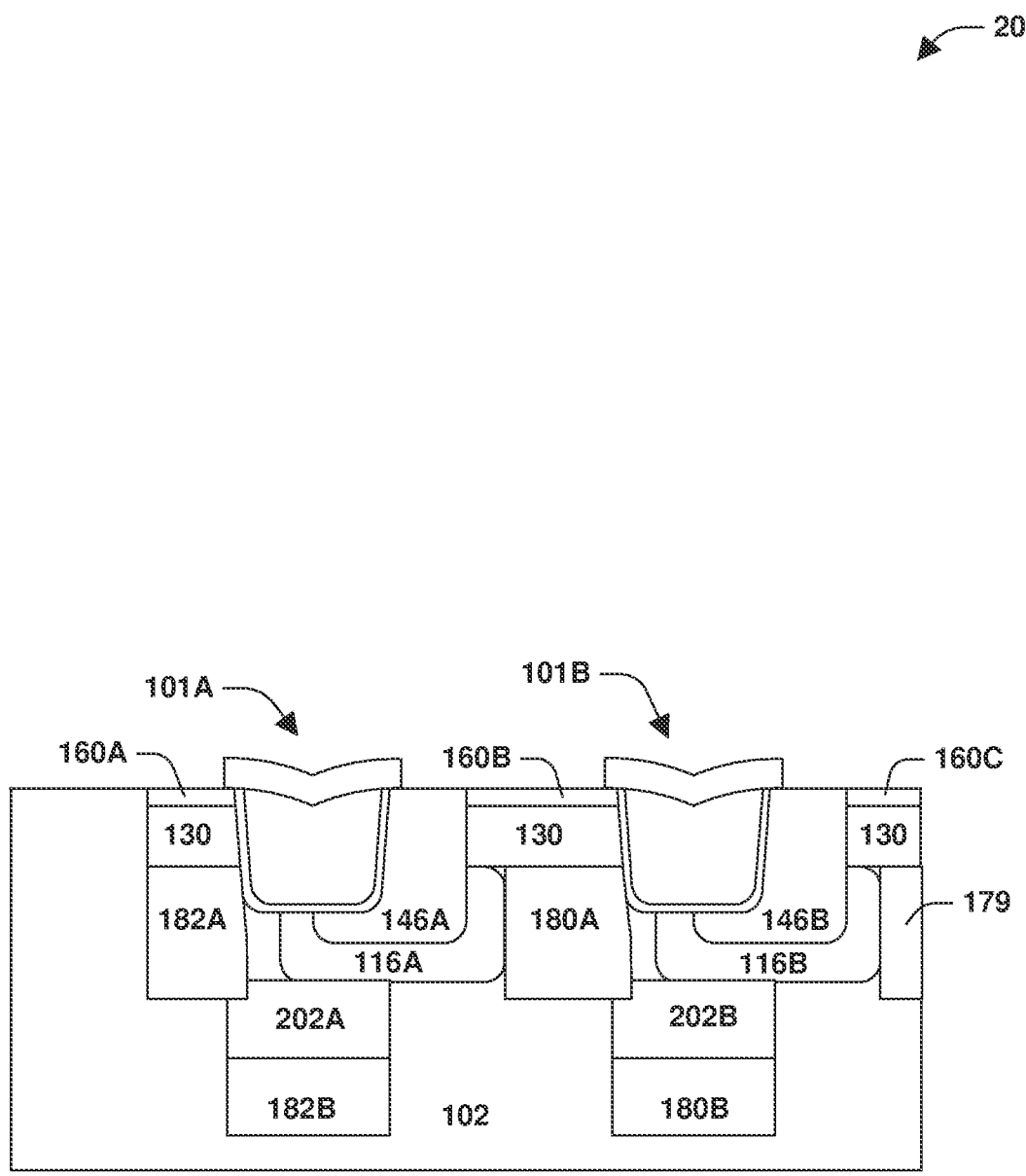
FIG. 2 illustrates a semiconductor device according to various examples.

In some examples, the body region 130 may be formed after the one or more trenches 170 are formed. For example, the body region 130 (and the one or more current spread regions, for example) may be formed using the third patterned photoresist 184 (e.g., an implantation process to form the body region and the fifth implantation process to form the one or more current spread regions may both be formed using the third patterned photoresist 184). FIG. 2 illustrates an example 200, of the semiconductor device, in which the body region 130 is formed after the one or more trenches 170 are formed. In some examples, a sixth implantation process is performed to form the body region 130, of the first conductivity type, in the semiconductor body 102. The sixth implantation process (e.g., an ion implantation process) may comprise implanting third dopants, of the first conductivity type, through the top surface of the semiconductor body 102, to form the body region 130. The sixth implantation process may comprise implanting fourth dopants, through bottoms of the one or more trenches 170, to form regions 202 that underlie the trenches 170 and overlie portions, of the one or more current spread regions, underlying the one or more trenches 170. In an example, the regions 202 may comprise at least one of a third region 202A, a fourth region 202B, etc. The fourth region 202B may underlie the second gate structure 101B and may overlie the second portion 180B of the second current spread region 180. The fourth region 202B may provide shielding to the gate structure 101B, such as due, at least in part, to an electrical potential of the fourth region 202B. The fourth region 202B may be connected to the first contact (e.g., the source contact) via an electrical connection (not shown). For example, the electric potential of the fourth region 202B may be based upon an electric potential of the first contact. Alternatively and/or additionally, the fourth region 202B may be in contact with and/or may overlap with one or more p-doped regions, wherein the electric potential of the fourth region 202B may be based upon an electric potential of the one or more p-doped regions.

Figure 3A:
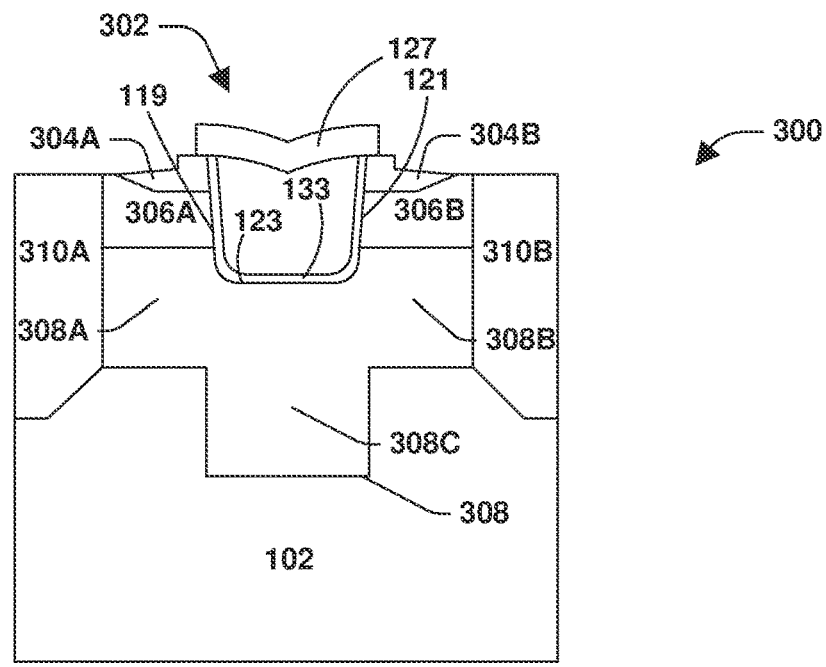
FIG. 3A illustrates a semiconductor device according to various examples.
Figure 3B:
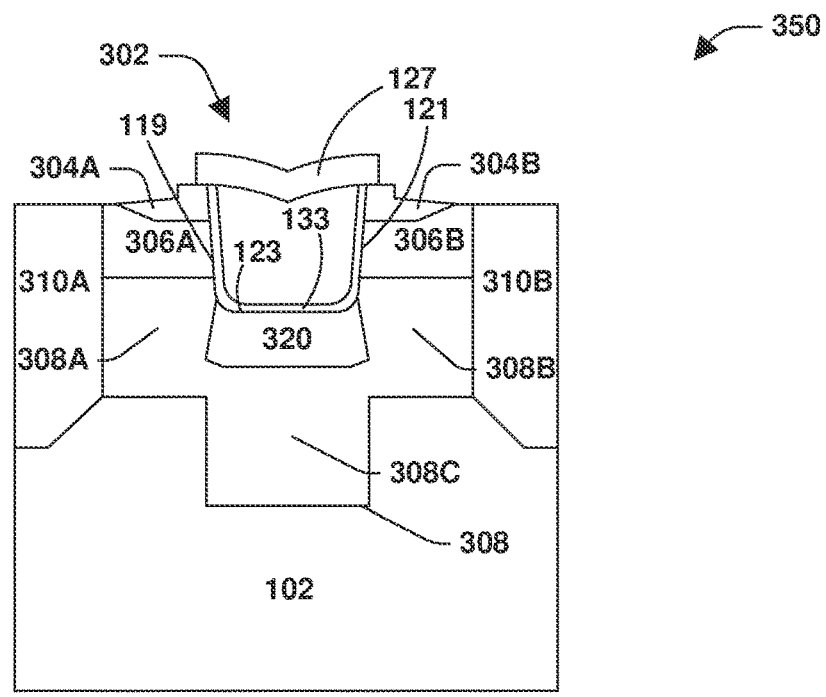
FIG. 3B illustrates a semiconductor device according to various examples.

FIGS. 3A-3B illustrate embodiments in which the semiconductor device is a dual-channel semiconductor device (e.g., a dual-channel MOSFET). FIG. 3A illustrates an example 300 of the dual-channel semiconductor device. The dual-channel semiconductor device may comprise a current spread region 308 comprising a first portion 308A, a second portion 308B and/or a third portion 308C. In some examples, an implantation process (e.g., the fifth implantation process) comprises implanting first dopants, through the top surface of the semiconductor body 102, to form the first portion 308A and the second portion 308B of the current spread region 308 (e.g., the first portion 308A and the second portion 308B may be formed via implanting the first dopants through the top surface of the semiconductor body 102). In some examples, the implantation process (e.g., the fifth implantation process) comprises implanting second dopants, through a bottom of a trench (e.g., a trench of the one or more trenches 170), to form the third portion 308C of the current spread region 308 (e.g., the third portion 308C may be formed via implanting the first dopants through the top surface of the semiconductor body 102). The current spread region 308 may adjoin a gate structure 302. A first source region 304A (of the second conductivity type, for example), a first body region 306A (of the first conductivity type, for example) and/or the first portion 308A of the current spread region 308 (of the second conductivity type, for example) may adjoin the first sidewall 119 of the gate structure 302.

A second source region 304B (of the second conductivity type, for example), a second body region 306B (of the first conductivity type, for example) and/or the second portion 308B of the current spread region 308 (of the second conductivity type, for example) may adjoin the second sidewall 121, of the gate structure 302, opposite the first sidewall 119. A vertical position of the first portion 308A of the current spread region 308 and a vertical position of the second portion 308B of the current spread region 308 may match a vertical position of the gate structure 302 (e.g., a vertical position of at least some of the first portion 308A of the current spread region 308 and a vertical position of at least some of the second portion 308B of the current spread region 308 may match a vertical position of at least some of the gate structure 302). The third portion 308C of the current spread region 308 may underlie the gate structure 302. In some examples, the current spread region 308, the gate structure 302, the first source region 304A, the second source region 304B, the first body region 306A and/or the second body region 306B may be between a first shielding region 310A (e.g., a first shielding region comprising a p-bury region and/or a p-top region) and/or a second shielding region 310B (e.g., a second shielding region comprising a p-bury region and/or a p-top region). In some examples, the first body region 306A and/or the first portion 308A of the current spread region 308 adjoin the first shielding region 310A. In some examples, the second body region 306B and/or the second portion 308B of the current spread region 308 adjoin the second shielding region 310B.

FIG. 3B illustrates an example 300, of the dual-channel semiconductor device, in which a region 320, of the first conductivity type, is formed between the third portion 308C of the current spread region 308 and the gate structure 302. In some examples, the region 320 provides shielding to the gate structure 302 (e.g., the region 320 may provide shielding to the bottom side 123 of the gate structure 302), such as due, at least in part, to an electrical potential of the region 320. The region 320 may be connected to the first contact (e.g., the source contact) via an electrical connection (not shown). For example, the electric potential of the region 320 may be based upon an electric potential of the first contact. In some examples, the region 320 may be formed via an implantation process (e.g., the sixth implantation process) that is performed to form one or more body regions (e.g., the first body region 306A, the second body region 306B, etc.). For example, the implantation process may be performed after the one or more trenches 170 are formed, wherein the first body region 306A and/or the second body region 306B may be formed via implanting dopants through the top surface of the semiconductor body 102 and/or the region 320 may be formed via implanting dopants through a bottom of a trench 170. In some examples, the region 320 may be electrically connected to a source region (e.g., at least one of the first source region 304A, the second source region 304B, etc.).

Figure 4:
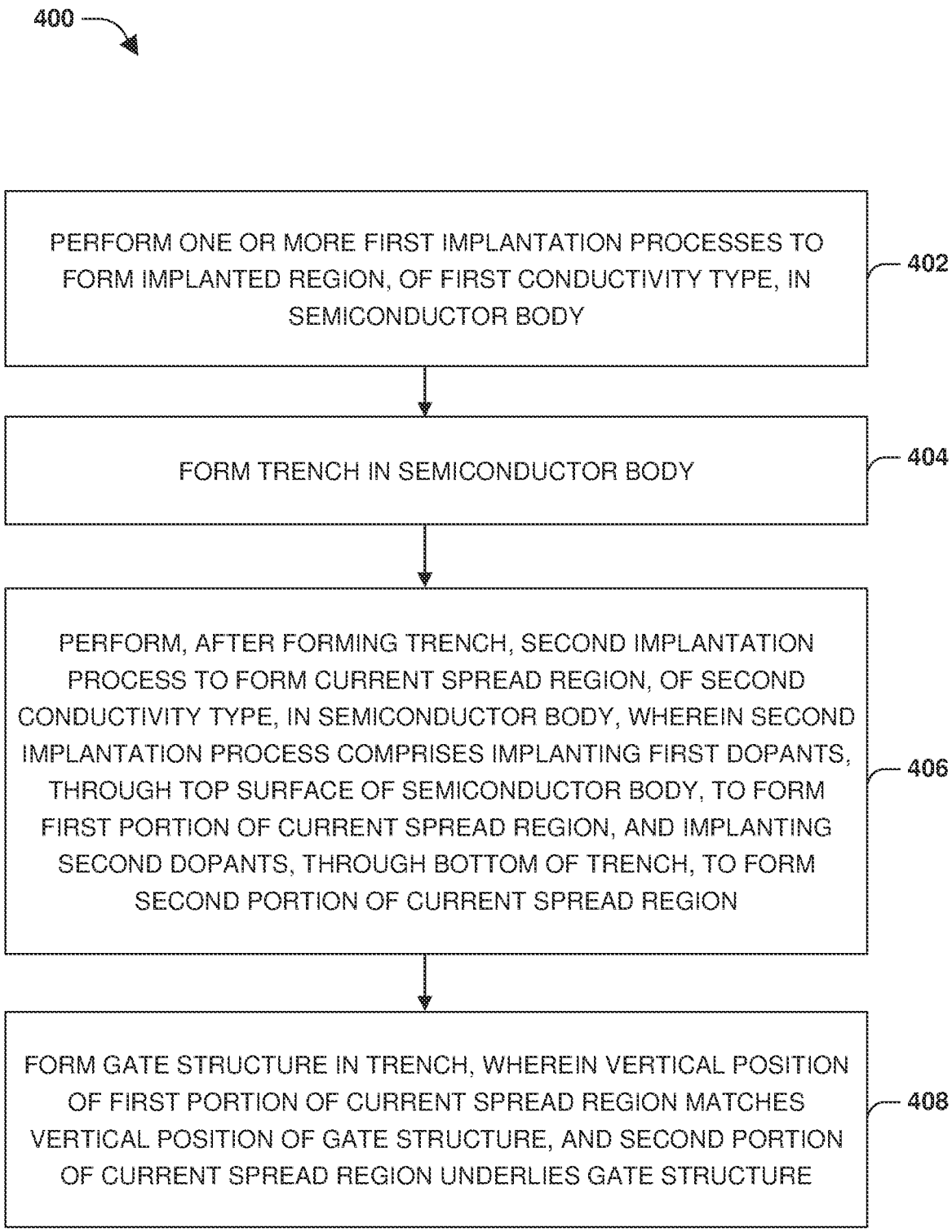
FIG. 4 is an illustration of an example method in accordance with the techniques presented herein.

FIG. 4 is an illustration of an example method 400 for manufacturing a semiconductor device. At 402, one or more implantation processes are performed to form an implanted region (e.g., a shielding region), of a first conductivity type (e.g., p-type), in a semiconductor body (e.g., the semiconductor body 102). In an example, the implanted region comprises a bury region of the one or more bury regions 116 and/or a region (e.g., p-top region) of the one or more regions 146. In an example, the one or more implantation processes comprise the first implantation process (shown in and/or described with respect to FIG. 1B) and/or the third implantation process (shown in and/or described with respect to FIG. 1D). At 404, a trench (e.g., a trench of the one or more trenches 170) is formed in the semiconductor body. At 406, after forming the trench, an implantation process (e.g., the fifth implantation process shown in and/or described with respect to FIG. 1G) is performed to form a current spread region, of a second conductivity type (e.g., n-type), in the semiconductor body. The implantation process may comprise implanting first dopants, through a top surface of the semiconductor body, to form a first portion of the current spread region (e.g., the first portion 180A of the second current spread region 180). The implantation process may comprise implanting second dopants, through a bottom of the trench, to form a second portion of the current spread region (e.g., the second portion 180B of the second current spread region 180). At 408, a gate structure is formed in the trench (e.g., the second gate structure 101B is formed in the second trench 170B). A vertical position of the first portion of the current spread region matches a vertical position of the gate structure. The second portion of the current spread region underlies the gate structure.

Figure 5:
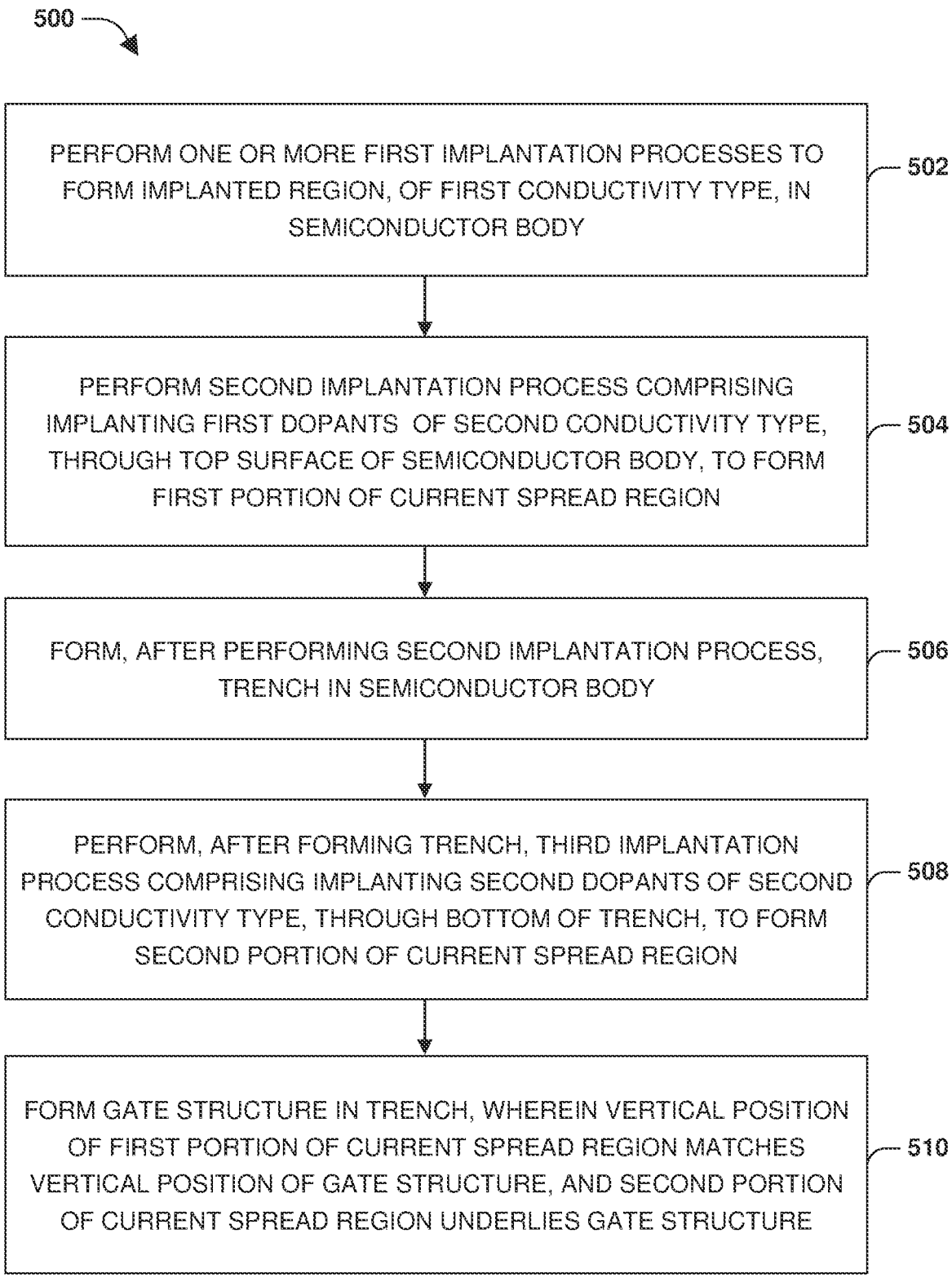
FIG. 5 is an illustration of an example method in accordance with the techniques presented herein.

FIG. 5 is an illustration of an example method 500 for manufacturing a semiconductor device. At 502, one or more implantation processes are performed to form an implanted region (e.g., a shielding region), of a first conductivity type (e.g., p-type), in a semiconductor body (e.g., the semiconductor body 102). In an example, the implanted region comprises a bury region of the one or more bury regions 116 and/or a region (e.g., p-top region) of the one or more regions 146. In an example, the one or more implantation processes comprise the first implantation process (shown in and/or described with respect to FIG. 1B) and/or the third implantation process (shown in and/or described with respect to FIG. 1D). At 504, a seventh implantation process is performed. The seventh implantation process may comprise implanting first dopants of a second conductivity type (e.g., n-type), through a top surface of the semiconductor body, to form a first portion of a current spread region (e.g., at least one of the first portion 182A of the first current spread region 182, the first portion 180A of the second current spread region 180, etc.). In an example, the seventh implantation process comprises a blanket implantation extending horizontally across at least a portion of the semiconductor body. The seventh implantation process may be performed using one or more of the techniques provided herein with respect to the fifth implantation process. At 506, after performing the seventh implantation process, a trench (e.g., a trench of the one or more trenches 170) is formed in the semiconductor body. At 508, after forming the trench, an eighth implantation process is performed. The eighth implantation process may comprise implanting second dopants of the second conductivity type, through a bottom of the trench, to form a second portion of the current spread region (e.g., at least one of the second portion 182B of the first current spread region 182, the second portion 180B of the second current spread region 180, etc.). The eighth implantation process may be performed using one or more of the techniques provided herein with respect to the fifth implantation process. In an example, the eighth implantation process comprises a blanket implantation extending horizontally across at least a portion of the semiconductor body. For example, in addition to the eighth implantation process comprising implantation of dopants through bottoms of trenches (e.g., the one or more trenches 170) in the semiconductor body 102, the eighth implantation process may also comprise implantation of dopants through the top surface of the semiconductor body 102 (e.g., the eighth implantation process may increase a concentration of dopants, of the second conductivity type, in the first portion of the current spread region formed via the seventh implantation process). Alternatively and/or additionally, a patterned photoresist and/or a patterned hard mask may be used in the eighth implantation process to block at least some dopants from passing through the top surface of the semiconductor body 102 (e.g., the patterned photoresist and/or the patterned hard mask may overlie and/or cover regions of the top surface of the semiconductor body 102 that are laterally offset from trenches in the semiconductor body 102). At 510, a gate structure is formed in the trench (e.g., the second gate structure 101B is formed in the second trench 170B). A vertical position of the first portion of the current spread region matches a vertical position of the gate structure. The second portion of the current spread region underlies the gate structure.

According to some embodiments, a method for manufacturing a semiconductor device is provided. The method includes performing one or more first implantation processes to form an implanted region, of a first conductivity type, in a semiconductor body; forming a trench in the semiconductor body; performing, after forming the trench, a second implantation process to form a current spread region, of a second conductivity type, in the semiconductor body, wherein the second implantation process includes: implanting first dopants, through a top surface of the semiconductor body, to form a first portion of the current spread region, and implanting second dopants, through a bottom of the trench, to form a second portion of the current spread region; and forming a gate structure in the trench, wherein a vertical position of the first portion of the current spread region matches a vertical position of the gate structure, and wherein the second portion of the current spread region underlies the gate structure.

According to some embodiments, the method includes forming a patterned mask over the top surface of the semiconductor body, wherein forming the trench is performed using the patterned mask; and removing, prior to performing the second implantation process, the patterned mask.

According to some embodiments, the first portion of the current spread region adjoins a first sidewall of the gate structure; and the implanted region, of the first conductivity type, adjoins a second sidewall, of the gate structure, opposite the first sidewall of the gate structure.

According to some embodiments, the method includes performing a third implantation process to form a body region, of the first conductivity type, in the semiconductor body, wherein at least a portion of the body region overlies the first portion of the current spread region and adjoins the first sidewall of the gate structure.

According to some embodiments, forming the gate structure includes forming a gate dielectric layer in the trench; and forming a gate electrode in the trench, wherein the gate dielectric layer separates the gate electrode from the semiconductor body.

According to some embodiments, a maximum implantation energy level of the second implantation process is at most 2,000 kiloelectron volts (keV).

According to some embodiments, a difference between a first vertical distance and a second vertical distance is at most 200 nanometers; the first vertical distance corresponds to a distance between a vertical position of a top side of the first portion of the current spread region and a vertical position of the top surface of the semiconductor body; and the second vertical distance corresponds to a distance between a vertical position of a top side of the second portion of the current spread region and a vertical position of a bottom side of the gate structure.

According to some embodiments, the semiconductor body includes a SiC substrate; and/or a SiC epitaxial layer overlying the SiC substrate.

According to some embodiments, the implanted region, of the first conductivity type, and the current spread region form a pn-junction.

According to some embodiments, the implanting the first dopants and the implanting the second dopants are performed concurrently.

According to some embodiments, the method includes selecting one or more parameters associated with a top side of the first portion of the current spread region adjoining the body region, wherein the second implantation process is performed using the one or more parameters, and wherein the one or more parameters include a quantity of ion implantation shots, an implantation energy level, and/or an ion implantation dose.

According to some embodiments, the method includes selecting one or more parameters associated with a vertical position of a bottom side of the first portion of the current spread region being lower than or equal to a vertical position of a top side of the second portion of the current spread region, wherein the second implantation process is performed using the one or more parameters, and wherein the one or more parameters include a quantity of ion implantation shots, an implantation energy level, and/or an ion implantation dose.

According to some embodiments, the method includes selecting one or more parameters associated with forming the first portion of the current spread region to extend from a first vertical position, that is higher than a vertical position of the bottom of the trench, to a second vertical position that is the same as or lower than the vertical position of the bottom of the trench, wherein the second implantation process is performed using the one or more parameters, and wherein the one or more parameters include a quantity of ion implantation shots, an implantation energy level, and/or an ion implantation dose.

According to some embodiments, the third implantation process to form the body region is performed after the trench is formed; the third implantation process includes: implanting third dopants, through the top surface of the semiconductor body, to form the body region, and implanting fourth dopants, through the bottom of the trench, to form a region of the first conductivity type; and the body region overlies the first portion of the current spread region; and the region of the first conductivity type overlies the second portion of the current spread region.

According to some embodiments, the third implantation process to form the body region is performed before the trench is formed.

According to some embodiments, a method for manufacturing a semiconductor device is provided. The method includes performing one or more first implantation processes to form an implanted region, of a first conductivity type, in a semiconductor body; performing a second implantation process including implanting first dopants of a second conductivity type, through a top surface of the semiconductor body, to form a first portion of a current spread region; forming, after performing the second implantation process, a trench in the semiconductor body; performing, after forming the trench, a third implantation process including implanting second dopants of the second conductivity type, through a bottom of the trench, to form a second portion of the current spread region; and forming a gate structure in the trench, wherein a vertical position of the first portion of the current spread region matches a vertical position of the gate structure, and wherein the second portion of the current spread region underlies the gate structure.

According to some embodiments, a semiconductor device is provided. The semiconductor device includes a semiconductor body including a body region of a first conductivity type, a current spread region of a second conductivity type, and an implanted region of the first conductivity type; a trench gate structure, in the semiconductor body, including a gate electrode and a gate dielectric layer separating the gate electrode from the semiconductor body, wherein the implanted region and the current spread region form a pn-junction, wherein a vertical position of a first portion of the current spread region matches a vertical position of the trench gate structure and the first portion of the current spread region adjoins a first sidewall of the trench gate structure, wherein a second portion of the current spread region underlies the trench gate structure, wherein a difference between a first vertical distance and a second vertical distance is at most 200 nanometers, wherein the first vertical distance corresponds to a distance between a vertical position of a top side of the first portion of the current spread region and a vertical position of a top surface of the semiconductor body, and wherein the second vertical distance corresponds to a distance between a vertical position of a top side of the second portion of the current spread region and a vertical position of a bottom side of the trench gate structure.

According to some embodiments, the semiconductor device includes a SiC substrate; and/or a SiC epitaxial layer overlying the SiC substrate.

According to some embodiments, the implanted region adjoins a second sidewall, of the trench gate structure, opposite the first sidewall of the trench gate structure.

According to some embodiments, the top side of the first portion of the current spread region adjoins the body region.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method of manufacturing a semiconductor device, comprising:
    performing one or more first implantation processes to form an implanted region, of a first conductivity type, in a semiconductor body;
    forming a trench in the semiconductor body;
    performing, after forming the trench, a second implantation process to form a current spread region, of a second conductivity type, in the semiconductor body, wherein the second implantation process comprises:
        implanting first dopants, through a top surface of the semiconductor body, to form a first portion of the current spread region; and
        implanting second dopants, through a bottom of the trench, to form a second portion of the current spread region; and
    forming a gate structure in the trench, wherein:
        a vertical position of the first portion of the current spread region matches a vertical position of the gate structure; and
        the second portion of the current spread region underlies the gate structure.

2. The method of claim 1, comprising:
    forming a patterned mask over the top surface of the semiconductor body, wherein forming the trench is performed using the patterned mask; and
    removing, prior to performing the second implantation process, the patterned mask.

3. The method of claim 1, wherein:
    the first portion of the current spread region adjoins a first sidewall of the gate structure; and
    the implanted region, of the first conductivity type, adjoins a second sidewall, of the gate structure, opposite the first sidewall of the gate structure.

4. The method of claim 3, comprising:
    performing a third implantation process to form a body region, of the first conductivity type, in the semiconductor body, wherein at least a portion of the body region overlies the first portion of the current spread region and adjoins the first sidewall of the gate structure.

5. The method of claim 4, comprising:
    selecting one or more parameters associated with a top side of the first portion of the current spread region adjoining the body region, wherein:
        the second implantation process is performed using the one or more parameters; and
        the one or more parameters comprise at least one of a quantity of ion implantation shots, an implantation energy level, or an ion implantation dose.

6. The method of claim 4, wherein:
    the third implantation process to form the body region is performed after the trench is formed;
    the third implantation process comprises:
        implanting third dopants, through the top surface of the semiconductor body, to form the body region; and
        implanting fourth dopants, through the bottom of the trench, to form a region of the first conductivity type; and
    the body region overlies the first portion of the current spread region; and
    the region of the first conductivity type overlies the second portion of the current spread region.

7. The method of claim 4, wherein:
    the third implantation process to form the body region is performed before the trench is formed.

8. The method of claim 3, wherein:
    forming the gate structure comprises:
        forming a gate dielectric layer in the trench; and
        forming a gate electrode in the trench, wherein the gate dielectric layer separates the gate electrode from the semiconductor body.

9. The method of claim 1, wherein:
    a maximum implantation energy level of the second implantation process is at most 2,000 kiloelectron volts (keV).

10. The method of claim 1, wherein:
    a difference between a first vertical distance and a second vertical distance is at most 200 nanometers;
    the first vertical distance corresponds to a distance between a vertical position of a top side of the first portion of the current spread region and a vertical position of the top surface of the semiconductor body; and
    the second vertical distance corresponds to a distance between a vertical position of a top side of the second portion of the current spread region and a vertical position of a bottom side of the gate structure.

11. The method of claim 1, wherein:
the semiconductor body comprises at least one of:
   a silicon carbide (SiC) substrate; or
   a SiC epitaxial layer overlying the SiC substrate.

12. The method of claim 1, wherein:
the implanted region, of the first conductivity type, and the current spread region form a pn-junction.

13. The method of claim 1, wherein:
the implanting the first dopants and the implanting the second dopants are performed concurrently.

14. The method of claim 1, comprising:
selecting one or more parameters associated with a vertical position of a bottom side of the first portion of the current spread region being lower than or equal to a vertical position of a top side of the second portion of the current spread region, wherein:
   the second implantation process is performed using the one or more parameters; and
   the one or more parameters comprise at least one of a quantity of ion implantation shots, an implantation energy level, or an ion implantation dose.

15. The method of claim 1, comprising:
selecting one or more parameters associated with forming the first portion of the current spread region to extend from a first vertical position, that is higher than a vertical position of the bottom of the trench, to a second vertical position that is the same as or lower than the vertical position of the bottom of the trench, wherein:
   the second implantation process is performed using the one or more parameters; and
   the one or more parameters comprise at least one of a quantity of ion implantation shots, an implantation energy level, or an ion implantation dose.

16. A method of manufacturing a semiconductor device, comprising:
   performing one or more first implantation processes to form an implanted region, of a first conductivity type, in a semiconductor body;
   performing a second implantation process comprising implanting first dopants of a second conductivity type, through a top surface of the semiconductor body, to form a first portion of a current spread region;
   forming a trench in the semiconductor body;
   performing, after forming the trench, a third implantation process comprising implanting second dopants of the second conductivity type, through a bottom of the trench, to form a second portion of the current spread region; and
   forming a gate structure in the trench, wherein:
      a vertical position of the first portion of the current spread region matches a vertical position of the gate structure; and
      the second portion of the current spread region underlies the gate structure.

* * * * *